US007026870B2

(12) United States Patent
Nakamura et al.

(10) Patent No.: US 7,026,870 B2
(45) Date of Patent: Apr. 11, 2006

(54) LOW-NOISE ACTIVE RC SIGNAL PROCESSING CIRCUIT

(75) Inventors: Masataka Nakamura, Hiroshima (JP); Takayuki Genba, Hiroshima (JP); Yuichiro Aomori, Hiroshima (JP); Shuji Yamaoka, Hiroshima (JP)

(73) Assignee: OHT, Inc., Hiroshima (JP)

( * ) Notice: Subject to any disclaimer, the term of this patent is extended or adjusted under 35 U.S.C. 154(b) by 73 days.

(21) Appl. No.: 10/482,125

(22) PCT Filed: Mar. 27, 2002

(86) PCT No.: PCT/JP02/02967

§ 371 (c)(1), (2), (4) Date: Dec. 24, 2003

(87) PCT Pub. No.: WO03/003575

PCT Pub. Date: Jan. 9, 2003

(65) Prior Publication Data

US 2004/0164796 A1 Aug. 26, 2004

(30) Foreign Application Priority Data

Jun. 27, 2001 (JP) ............................ 2001-195207

(51) Int. Cl.
*H03F 1/34* (2006.01)

(52) U.S. Cl. ........................................ 330/85; 330/109

(58) Field of Classification Search ................ 327/552, 327/557, 558, 559; 330/85, 100, 107, 109, 330/194, 303, 306
See application file for complete search history.

(56) References Cited

U.S. PATENT DOCUMENTS

| | | | | |
|---|---|---|---|---|
| 4,030,043 | A | 6/1977 | Hamilton | 330/69 X |
| 4,074,204 | A * | 2/1978 | Broburg et al. | 330/109 |
| 4,524,331 | A * | 6/1985 | Faith | 330/292 |
| 5,293,087 | A * | 3/1994 | Hamano et al. | 327/558 |

FOREIGN PATENT DOCUMENTS

JP 6-37586 2/1994

OTHER PUBLICATIONS

Yuichiro Aomori et al.; The Institute of Electronics, Information and Communication Engineers 2001, pp. 20-21, Mar. 7, 2001. Cited in the int'l. search report.

* cited by examiner

*Primary Examiner*—Steven Mottola
(74) *Attorney, Agent, or Firm*—Westerman, Hattori, Daniels & Adrian, LLP

(57) ABSTRACT

Disclosed is a low-noise active RC signal processing circuit, which comprises a feedforward section operable responsive to an input signal to provide an output at a predetermined gain, and a feedback section operable responsive to the output of the forward circuit to negatively feed back the output to the input signal of the feedforward section while giving a predetermined transfer characteristic to the output, so as to allow the processing circuit to have a transfer impedance characteristic equal to or less than the predetermined gain over the entire frequency range. The feedforward section is composed of a current-controlled voltage output circuit which includes a common-base transistor for receiving and inverting the input signal, and an emitter-follower transistor for outputting voltage, and has a transfer impedance defining the predetermined gain. The current-controlled voltage output circuit may also be constructed using an operational amplifier. Various filters, such as a bandpass, lowpass or highpass filter, can be achieved by arranging the transfer impedance characteristic. The present invention can provide an active RC signal processing circuit having a low Q-value and an excellent low-noise performance.

6 Claims, 22 Drawing Sheets

LOW-NOISE ACTIVE RC SIGNAL PROCESSING CIRCUIT

TECHNICAL FIELD

The present invention relates to a low-noise active RC (resistor-capacitor) signal processing circuit, and more particularly to a low-noise active RC signal processing circuit operable to reduce gain over the entire frequency range through negative feedback so as to obtain transfer impedance characteristics suitable for a bandpass filter, lowpass filter or highpass filter.

BACKGROUND ART

With recent revolutionary advances in electronic technologies, the integration of electronic circuits and the digitalization of signal processing have become common techniques. In such circumstances, the miniaturization/integration of continuous-time system filters essential for analog signal processing has been developed in the form of active RC filters. In particular, the use of higher frequency bands being accelerated in line with recent digitalization requires taking up the challenge of assuring high frequency characteristics. Therefore, signal processing in higher frequency bands has been developed to achieve high frequency characteristics and high integration in active RC filters. In terms of noise problems involved in signal processing, continuous-time system filters also have advantage in intermediate or low frequency characteristics, and developments for achieving active RC filters usable in intermediate or low frequency bands and integration thereof have been made.

A second-order active circuit as a fundamental element of such an active RC filter includes a Sallen-Key circuit using a positive-phase-sequence amplifier, a circuit using a single amplifier and a circuit using a gyrator.

In the Sallen-Key circuit, a positive feedback characteristic is caused at the polar frequency (center frequency), and the sensitivity of Q to variations in associated elements is extremely high. While the single-amplifier type circuit based on multiple-feedback can stably achieve a high Q-value, it has a feed gain including the open loop gain of an operational amplifier at the polar frequency. While the transistor gyrator circuit can also stably obtain a high Q-value in a high frequency range without difficulties, a positive feedback characteristic is caused at the polar frequency, and thus a desirable low-noise performance is hardly obtained.

As above, even though the conventional active RC filters based on the second-order active circuits, such as the Sallen-Key circuit using a positive-phase-sequence amplifier, the single-amplifier type circuit and the gyrator circuit, can conveniently obtain a high Q-values, all of them cannot maintain a negative feedback loop at the polar frequencies of the second-order active circuit. Thus, these RC filters still involve a problem of difficulty in sufficiently reducing noises.

Due to the difficulty in striking a balance between high Q-value and low noise performance in a high frequency range, any active RC filter usable in a high frequency range has not been put to practical use up to now. In the practical design of filter circuits for use in a high frequency range, it has no choice but to employ an active coil (chip inductor) and externally combine it therewith. In particulate, this constitutes an adverse factor against achievement of small-sized monolithic ICs for use in a high frequency range.

Thus, there is still the need for facilitating integration between various filter circuits including an inductance and other circuits to provide downsized circuitries.

It is therefore an object of the present invention to provide an active RC signal processing circuit having a transfer function capable of changing a negative feedback loop gain such that a transmission gain is reduced at a value equal to or less than a forward gain over the entire frequency range, to achieve a low noise characteristic.

DISCLOSURE OF INVENTION

In order to achieve the above object, the present invention provides a low-noise active RC signal processing circuit comprising a feedforward section operable responsive to an input signal to provide an output at a predetermined gain, and a feedback section operable responsive to the output of the forward circuit to negatively feed back the output to the input signal of the feedforward section while giving a predetermined transfer characteristic to the output, so as to allow the processing circuit to have a transfer impedance characteristic equal to or less than the predetermined gain over the entire frequency range.

In the above low-noise active RC signal processing circuit, the feedforward section may be a current-controlled voltage output circuit. In this case, the current-controlled voltage output circuit may include a common-base transistor for receiving and inverting the input signal, and an emitter-follower transistor for outputting voltage, and may have a transfer impedance defining the predetermined gain. Alternatively, the current-controlled voltage output circuit may include an operational amplifier operable to invert the input signal, wherein the operational amplifier is subjected to feedback according to the transfer impedance defining the predetermined gain.

In the above low-noise active RC signal processing circuit, the feedback section may be a multistage active RC circuit operable to provide a frequency-dependent characteristic to the output from the feedforward section. Alternatively, the feedback section may be a voltage-follower circuit operable to provide a frequency-dependent characteristic to the output from the feedforward section. The voltage-follower circuit may include an operational amplifier and a multistage RC circuit.

The low-noise active RC signal processing circuit may be a bandpass filter, lowpass filter or highpass filter. In this case, the transfer impedance characteristic defines the frequency characteristic of the filter.

BEST MODE FOR CARRYING OUT THE INVENTION

With reference to the drawings, a low-noise active RC signal processing circuit of the present invention will now be described.

The fundamental principle of a negative feedback control for allowing a transmission gain to be reduced at a value equal to or less than a forward gain over the entire frequency range in the signal processing circuit of the present invention will be first described in connection with FIG. 1.

The signal processing circuit of the present invention employs a feedback type active RC filter circuit. FIG. 1 is a block diagram showing the feedback type circuit.

Figure 1:
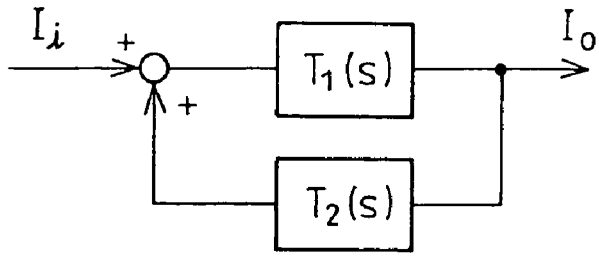
FIG. 1 is a basic block diagram showing a feedback type signal processing circuit of the present invention.

In FIG. 1, given that an input current is Ii, an output current being Io, the transfer function of a feedforward section being $T_1(s)$, and the transfer function of a feedback section being $T_2(s)$, respectively. The input-output transfer function T(s) is expressed by the following formula:

$$\begin{aligned} T(s) &= Io/Ii \\ &= T_1(s)/[1 - T_1(s)\cdot T_2(s)] \end{aligned} \tag{1}$$

In order to allow the feedback type circuit in FIG to have a negative feedback characteristic such that a transmission gain is reduced at a value equal to or less than a forward gain, it is required to satisfy the following condition base on the input-output transfer function T(s) in the formula (1):

$$\|T(s)\| = |T_1(s)| \tag{2}$$

A desired filter characteristic can be achieved by selecting the transfer functions $T_1(s)$ and $T_2(s)$ which satisfy the condition expressed by the formula (2).

However, it is difficult for the circuit in FIG. 1 to satisfy the condition of the formula (2) in the entire frequency range including the polar frequency. Thus, the function is transformed by introducing a constant "a" (a>1) into the denominator of the input-output transfer function T(s) in the formula (1). Consequently, the input-output transfer function T(s) in the formula (1) can be transformed as follows:

$$\begin{aligned} T(s) &= T_1(s)/a[1 - T_1(s)\cdot T_2(s)] \\ &= T_1(s)/[1 + a - 1 - aT_1(s)\cdot T_2(s)] \end{aligned} \tag{3}$$

Comparing between the respective input-output transfer functions T(s) in the formulas (1) and (3), it is proved that the transfer function $T_2(s)$ of the feedback section in the formula (1) can be modified into $(1-a)/T_1(s)+aT_2(s)$, to obtain an input-output transfer function T(s) satisfying the condition of the formula (2).

In the present invention, according to the principle based on the formula (2), the transfer functions $T_1(s)$ and $T_2(s)$ are selected such that a transmission gain is reduced at a value equal to or less than a forward gain over the entire frequency range, to construct a low-noise active RC signal processing circuit having a desired frequency characteristic.

The present invention will be described in more detail in conjunction with a first embodiment which uses a bipolar-transistor-based current controlled voltage source (CCVS) in the feedforward section, and a second embodiment which uses an OP-Amp-based negative-phase-sequence CCVS, and specific examples thereof.

First Embodiment

None of the conventional Sallen-Key circuit, the multi-feedback type circuit and the gyrator circuit can achieve the circuit in FIG. 1 satisfying the condition of the formula (2). In a first embodiment of the present invention, a bipolar-transistor-based CCVS is employed in the feedforward section.

The transistor-based CCVS comprises a common-base transistor provided on the input side, an emitter-follower transistor provided on the output side, and a resistor $R_1$ connected between these transistors. Given that the input current and output voltage of the CCVS are Ii and Vo, respectively, the relation $Vo=R_1 \cdot Ii$ is satisfied, and the transfer impedance of the CCVS is $R_1$.

The transistor CCVS constructed as above capable of readily providing wideband characteristics is suitable for the high-frequency-compatible signal processing circuit of the present invention intended to obtain a desirable transmission gain over the entire frequency range. Further, the resistor serving as the transfer impedance allows $T_1(s)$ as the numerator of the formula (2) to be constant. Thus, only the transfer function in the denominator of the formula (2) can be selected to satisfy the condition of the formula (2) so as to obtain a desired frequency characteristic.

Figure 2:
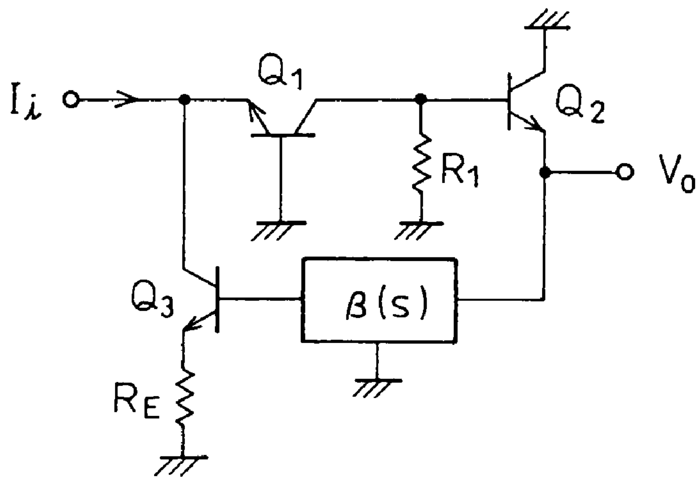
FIG. 2 is a basic block diagram showing a feedback type signal processing circuit according to a first embodiment of the present invention, wherein a transistor-based current controlled voltage source is used in a feedforward section.

FIG. 2 is a basic block diagram showing a filter circuit which has a feedforward section using a transistor-based CCVS, in accordance with the feedback type circuit having the input-output transfer function T(s). In this filter circuit, the transistor CCVS comprises a common-base bipolar transistor $Q_1$, an emitter-follower bipolar transistor $Q_2$, and a resistor $R_1$, and forms the feedforward section of the feedback type active RC filter circuit. A feedback section is connected between the input and output sides of the CCVS.

The basic block diagram in FIG. 2 shows only connections to the AC components of a signal, and omits any DC bias lines for driving the transistors. All of after-mentioned basic block diagrams are illustrated in the same way.

In FIG. 2, given that each of the transistors used in the filter circuit is an ideal transistor, the input-output transfer function T(s) of the circuit can be expressed by the following formula in the form of transfer impedance:

$$\begin{aligned} T(s) &= Vo/Ii \\ &= R_1/[1+(R_1/R_E)\beta(s)], \end{aligned} \tag{4}$$

wherein β(s) is a transmission function of the feedback section.

This transmission function can be selected to provide a desired frequency characteristic, so that various filter circuits usable in a high frequency range can be achieved. Specific examples of the high-frequency-compatible low-noise signal processing circuit according to the first embodiment using the transistor CCVS will be described in more detail in connection with various filter circuits, particularly, a bandpass active RC filter, a lowpass active RC filter, and a highpass active RC filter.

(Bandpass Active RC Filter Circuit)

An input-output transfer impedance function T(s) for allowing the filter circuit in FIG. 2 to act as a second-order bandpass RC filter is given as the following formula:

$$T(s)=(R_1/Q)(s/\omega_0)/[1+(s/\omega_0)/Q+(s/\omega_0)^2] \tag{5}$$

Given that $T_1(j\omega_0)=R_1$, the negative feedback amount of the feedback section is increased to satisfy the inequality $T(j\omega_0)<R_1$, according to the condition of the formula (2).

Then, a constant "a" (a>1) is introduced into the denominator of the transfer impedance function T(s) of the formula (5) as follows:

$$T(s)=(R_1/Q)(s/\omega_0)/a[1+(s/\omega_0)/Q+(s/\omega_0)^2] \tag{6}$$

Then, the formula (6) is transformed to obtain a transfer impedance function T(s) expressed by the following formula:

$$T(s)=R_1/[1+a-1+aQ[(s/\omega_0)+(\omega_0/s)]] \tag{7}$$

As seen from the formula (7), the decrease in level of a transmission gain is generated by the terms "$a-1+aQ[(s/\omega_0)+(\omega_0/s)]$" in the denominator of the formula (7) or by changing the negative feedback loop gain, independently of the gain of the feedforward section.

A transmission function β(s) for the formula (7) can be obtained with reference to the formula (5), as follows:

$$\beta(s)=(R_E/R_1)[a-1+aQ\{(s/\omega_0)+(\omega_0/s)\}] \tag{8}$$

In this case, $$T_1(j\omega_0)=R_1/(1+a-1) \tag{9}$$

Further, when $s=j\omega_0$, an open loop gain is "1−a".

Figure 3:
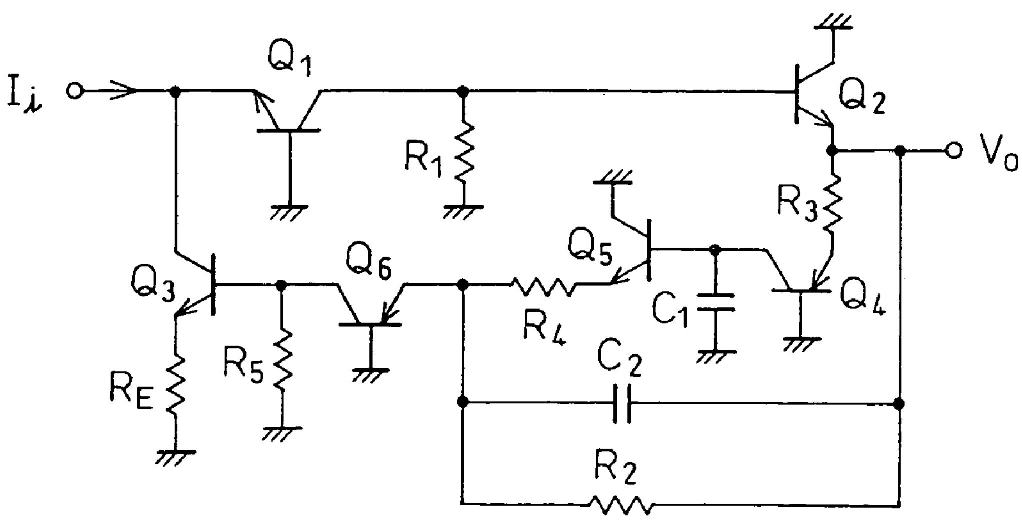
FIG. 3 is a basic block diagram showing a second-order bandpass active RC filter circuit according to the first embodiment.

FIG. 3 is a basic block diagram showing a second-order bandpass active RC filter circuit based on the transmission function β(s) of the formula (8). In this filter circuit, a feedforward section comprises a transistor-based CCVS including transistors $Q_1$ and $Q_2$, and a resistor $R_1$, and a feedback section comprises transistors $Q_3$ to $Q_6$, capacitors $C_1$ and $C_2$, and resistors $R_2$ to $R_5$ and $R_E$. Given that each of these transistors is an ideal transistor, the transfer function of the second-order bandpass active RC filter circuit in FIG. 3 can be expressed as follows:

$$T(s)=R_1/[1+(R_1/R_E)[R_5/R_2+sC_2R_5+(R_5/R_4)/(sC_1R_3)]] \tag{10}$$

In this case, the angular frequency $\omega_0$ at the center frequency of this filter circuit, and the Q-value can be calculated by the following formulas:

$$\omega_0=(C_1C_2R_3R_4)^{-1/2} \tag{11}$$

$$Q=(C_2/C_1)^{1/2}R_5/(R_3R_4)^{1/2}(R_E/R_1+R_5/R_2) \tag{12}$$

The loop gain "1−a" at the center frequency can also be calculated by the following formula:

$$1-a=-(R_5/R_2)(R_1/R_E) \tag{13}$$

Figure 4:
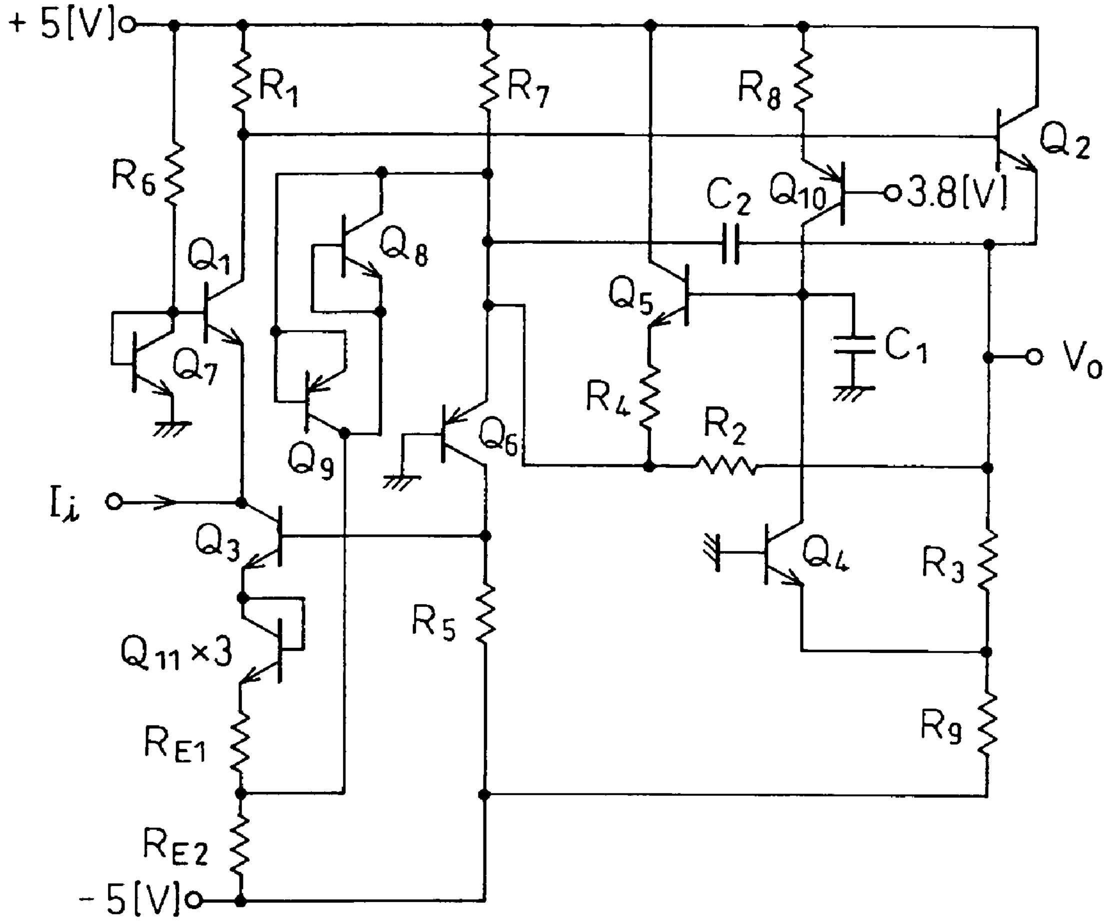
FIG. 4 is a block diagram showing a specific example of the second-order bandpass active RC filter circuit in FIG. 3.

As above, it is proved that the respective values of the capacitors and resistors in the feedback section can be adjusted to construct a second-order bandpass active RC filter having a desired frequency characteristic. FIG. 4 is a block diagram showing a specific example of the second-order bandpass active RC filter circuit. This block diagram includes DC bias lines for driving transistors.

The second-order bandpass active RC filter circuit in FIG. 4 was designed to achieve the targets of center frequency $f_0$=5 MHz and Q-value=10. In this filter circuit, 2SC3501 and 2SA1206 (available from HITACHI) were used as NPN bipolar transistors and PNP bipolar transistors, respectively. The respective values of capacitors and resistors were set as follows:

$C_1$=10, $C_2$=60 (unit: pF)

$R_1$=3.5, $R_2$=10, $R_3$=0.7, $R_4$=1.5, $R_5$=2.3, $R_6$=4.4, $R_7$=5.1, $R_8$=0.6, $R_9$=1.4, $R_{E1}$=0.1, $R_{E2}$=0.6 (unit: kO)

The transistors $Q_8$ and $Q_9$ in the second-order bandpass active RC filter circuit in FIG. 4 were connected as compensating capacitance.

Figure 5:
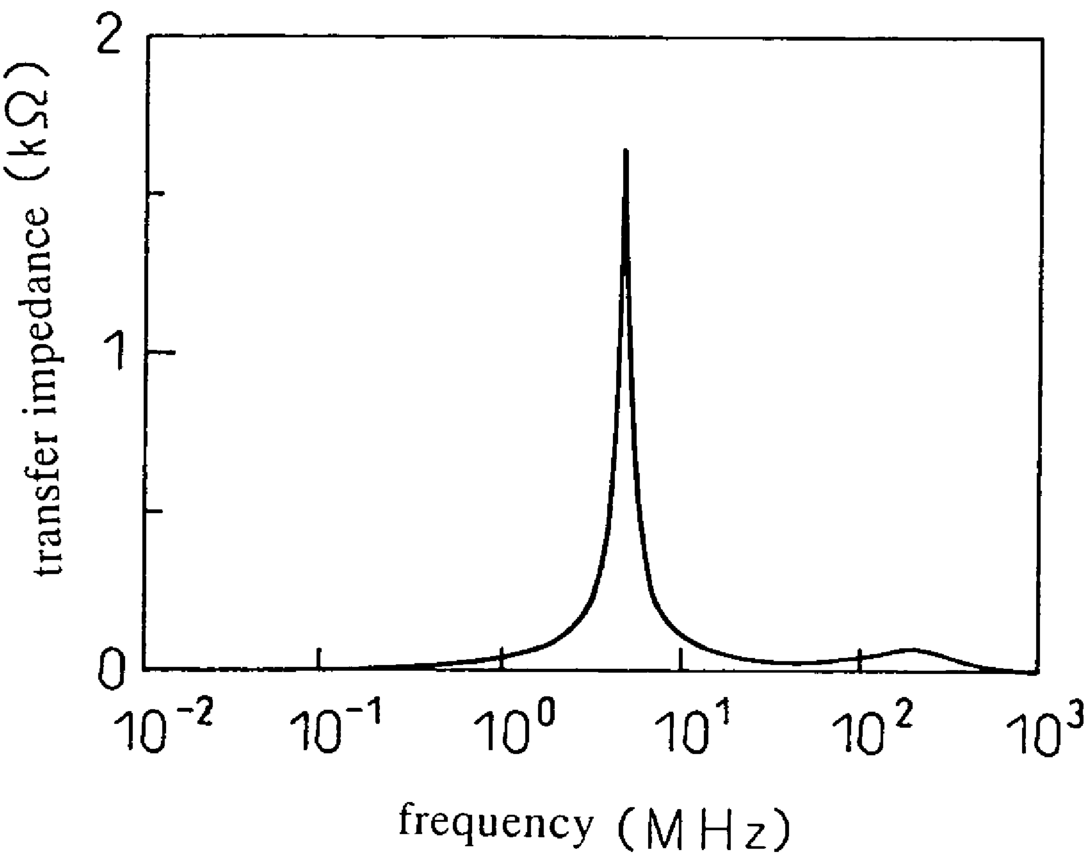
FIG. 5 is a graph showing a simulation result of the frequency-transfer impedance characteristic of the second-order bandpass active RC filter circuit in FIG. 4.

FIG. 5 shows a simulation result of the second-order bandpass active RC filter circuit in FIG. 4, wherein the horizontal and vertical axes represent frequency and the transfer impedance, respectively. As a result, this filter circuit had a center frequency $f_0$=4.81 MHz, and a Q-value=8.15. According to the simulation data, $|T(j|\omega_0)|$ was about 1.6 kO, which was less than the forward gain $R_1$=3.5 kO.

As seen from the simulation result in FIG. 5, the bandpass active RC filter circuit has a high Q-value at the center frequency $f_0$.

The ability of facilitating noise reduction in the second-order bandpass active RC filter circuit according to the above embodiment will be described below on the assumption of specific noise sources. Specifically, respective noise sources of the transistors incorporated in the second-order bandpass active RC filter circuit in FIG. 3 will be specified, and noise output thereof will be calculated.

Figure 6:
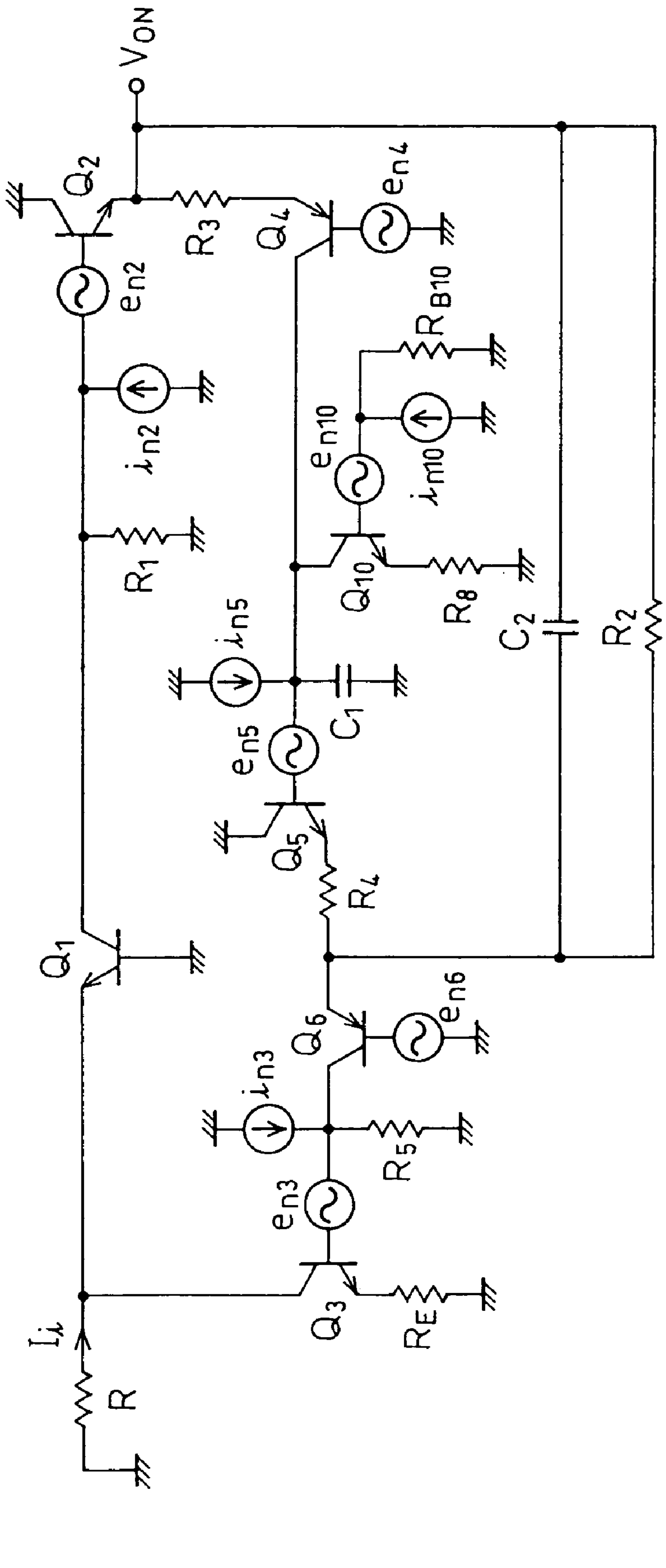
FIG. 6 is a block diagram showing another specific example of the second-order bandpass active RC filter circuit in FIG. 3, wherein the example is configured in consideration of noise sources.

FIG. 6 shows a filter circuit configured in consideration of noise sources. Given that noise sources at the center frequency are voltage sources $e_{nk}$, and current sources $i_{nk}$, wherein k corresponds to the number of each of transistors. In FIG. 6, the bandpass active RC filter circuit including the noise sources is configured in consideration of a DC bias constant current source $Q_{10}$.

As an example, noise outputs $V_{ON}(e_3)$ and $V_{ON}(i_3)$ caused, respectively, by the noise sources $e_{n3}$ and $i_{n3}$ concerning a transistor Q3 can be calculated by the following formulas:

$$|V_{ON}(e_3)|=|T(j|\omega_0)\cdot e_{n3}/R_E| \quad (14)$$

$$|V_{ON}(i_3)|=|T(j|\omega_0)\cdot i_{n3}R_5/R_E| \quad (15)$$

wherein $T(j|\omega_0)$, $\omega_0$ and Q-value are expressed as follows:

$$T(j|\omega_0)=R_1/[1+(R_5/R_2)(R_1/R_E)] \quad (16)$$

$$\omega_0=(C_1C_2R_3R_4)^{-1/2} \quad (17)$$

$$Q=\omega_0C_2R_5(R_1/R_E)/[1+(R_5/R_2)(R_1/R_E)] \quad (18)$$

Noise outputs $V_{ON}(e_k)$ and $V_{ON}(i_k)$ caused by the remaining noise sources $e_{nk}$ and $i_{nk}$ can be calculated in the same way.

Then, the value a, or negative feedback loop gain "a−1", can be changed while maintaining each of the center frequency $f_0$ and the Q-value at a constant value, to calculate respective noise coefficients $N_{vk}$ for the voltage sources or the noise sources $e_{nk}$, and respective noise coefficients $N_{Ik}$ for the current source or the noise sources $i_{nk}$. The noise coefficients $N_{vk}$, $N_{Ik}$ are expressed as follows:

$$N_{vk}=|V_{ON}(e_k)/e_{nk}| \quad (19)$$

$$N_{Ik}=|V_{ON}(e_k)/e_{nk}|| \quad (20)$$

In the filter circuit, the value of the resistor $R_2$ is adjusted to change the value a, and the respective values of the capacitor $C_2$ and the resistor $R_3$ is adjusted to maintain the center frequency $f_0$ and the Q-value at a content value. Some examples in which the values of the RC elements are adjusted to change the value a in this manner will be described below.

| | | | | | | |
|---|---|---|---|---|---|---|
| $R_2$ | 60 | 20 | 10 | 7 | 5 | (kO) |
| $R_3$ | 1.24 | 0.93 | 0.7 | 0.56 | 0.47 | (kO) |
| $C_2$ | 34 | 45 | 60 | 75 | 90 | (pF) |
| a | 1.18 | 1.54 | 2.07 | 2.54 | 3.15 | |
| $f_0$ | 5.00 | 5.02 | 5.01 | 5.01 | 5.00 | (MHz) |
| Q | 10.31 | 10.37 | 10.11 | 10.28 | 9.84 | |

The remaining RC elements other than the above RC elements are the same as those of the filter circuit in FIG. 4. Further, a resistor R in the input section is set at 3.5 kO, and $R_{10}$ is set at 0.9 kO. A capacitor $C_1$ is set at 16 pF in consideration of the collector capacitances of transistors $Q_4$, $Q_{10}$ and $Q_5$.

Figure 7:
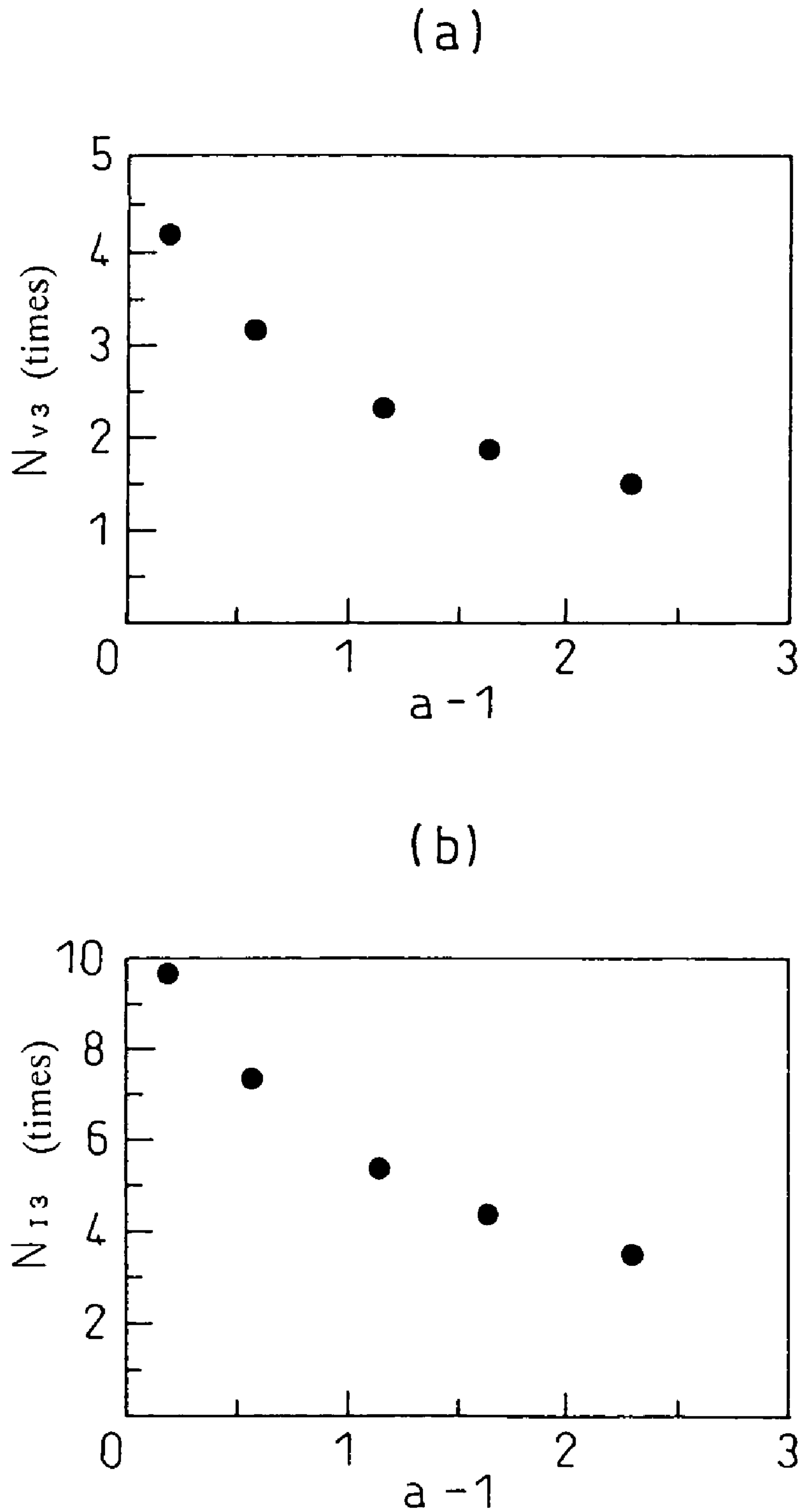
FIG. 7 is a graph showing the change of noise coefficient for loop gain.

The above values of the center frequencies $f_0$ and the Q-values were calculated by the formulas (17) and (18). Then, a noise coefficient for the level of negative feedback loop gain "a−1" is calculated using the noise outputs calculated by the formulas (14) and (15). For example, the respective noise coefficients $N_{V3}$, $N_{I3}$ for the noise sources $e_{n3}$, $i_{n3}$ can be calculated and plotted with respect to the noise coefficient for the gain "a−1" to obtained the graph in FIG. 7, wherein FIG. 7(*a*) shows the relationship with the noise coefficient $N_{V3}$ for the noise source $e_{n3}$, and FIG. 7(*b*) shows the relationship with the noise coefficient $N_{I3}$ for the noise source $i_{n3}$. As can be seen from the relationship between the level "a−1" of the loop gain and each of the noise coefficients $N_{V3}$, $N_{I3}$, the output noises can be reduced by designing the circuit such that the "a−1" is set at a larger value, or the negative feedback loop amount is increased, and the output noise is at a fairly high level when no negative feedback is applied or when a=1. The relationships between the gain "a−1" and each of the noise coefficients $N_{Vk}$, $N_{Ik}$ for the remaining noise sources $e_{nk}$, $i_{nk}$ exhibit the same tendencies as those in FIGS. 7(*a*) and 7(*b*), and the related noise outputs are also reduced.

(Lowpass Active RC Filter Circuit)

An input-output transfer impedance function T(s) for allowing the filter circuit in FIG. 2 to act as a second-order lowpass RC filter is given as the following formula:

$$T(s)=R_1/[1+(s/\omega_P)/Q+(s/\omega_P)^2] \quad (21)$$

This transfer function T(s) of the second-order lowpass RC filter can be achieved by applying the following formula to the function β(s) in the formula (4):

$$\beta(s)=(R_E/R_1)[(s/\omega_P)/Q+(s/\omega_P)^2] \quad (22)$$

However, when $s=j\omega_P$, $|T(j|\omega_P)|$ is expressed as follows:

$$T(j|\omega_P)|=QR_1 \quad (23)$$

This means that $|T(j|\omega_P)|$ will be greater than R1 or forward gain, and the condition $\|T(s)\|<|T_1(s)|$ cannot be maintained. Thus, in order to satisfy the condition $T(s)\|<R1$, the formula (21) can be modified as follows:

$$T(s)=R_1/a[1+(s/\omega_P)/Q+(s/\omega_P)^2], \quad (24)$$

wherein a>1.

Using the formula (24), the level of a transmission gain can be reduced by adjusting the negative feedback loop gain, independently of the forward gain $R_1/a$. In the same manner as in the formula (7), the transmission function β(s) of the negative feedback section can be calculated by the following formula:

$$\beta(s)=(R_E/R_1)[a-1+a(s/\omega_P)/Q+a(s/\omega_P)^2] \quad (25)$$

Figure 8:
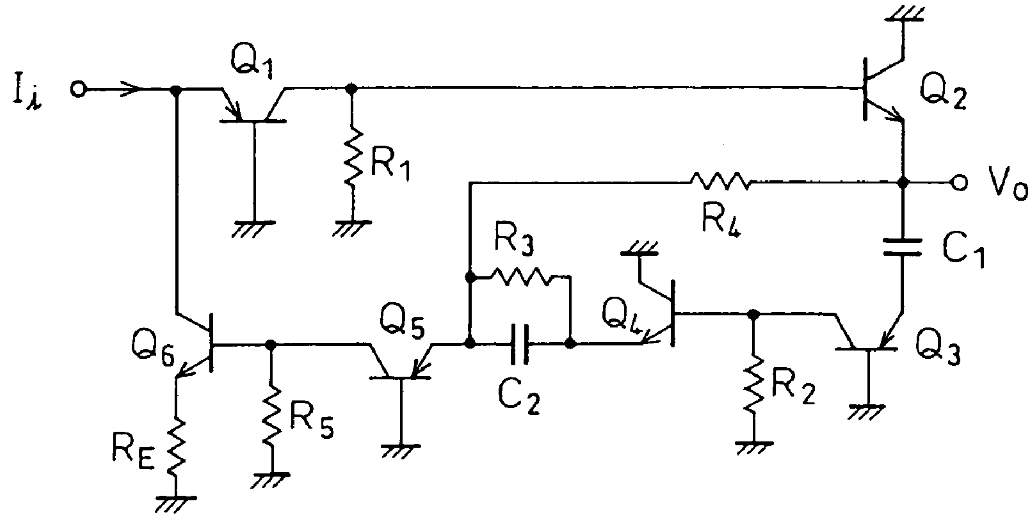
FIG. 8 is a basic block diagram showing a second-order lowpass active RC filter circuit according to the first embodiment.

FIG. 8 is a basic block diagram showing a second-order lowpass active RC filter circuit having this transmission function β(s). In this filter circuit, a feedforward section comprises a transistor-base CCVS including transistors $Q_1$ and $Q_2$, and a resistor $R_1$ serving as a transfer impedance, and a feedback section including transistors $Q_3$ to $Q_6$, capacitors $C_1$ and $C_2$, and resistors $R_2$ to $R_5$ and $R_E$.

Given that each of the transistors of the lowpass active RC filter circuit in FIG. 8 is an ideal element, the transmission function β(s), polar angular frequency cop, Q-value and value "a" are expressed as follows:

$$\beta(s)=R_5[1/R_4+sC_1R_2(1/R_3+sC_2)] \quad (26)$$

$$\omega_P=[(R_E/R_1+R_5/R_4)/(C_1C_2R_2R_5)]^{1/2} \quad (27)$$

$$Q=[(C_2/C_1)(R_3^2/R_2R_5)(R_E/R_1+R_5/R_4)]^{1/2} \quad (28)$$

$$a=1+(R_1/R_E)(R_5/R_4) \quad (29)$$

Figure 9:
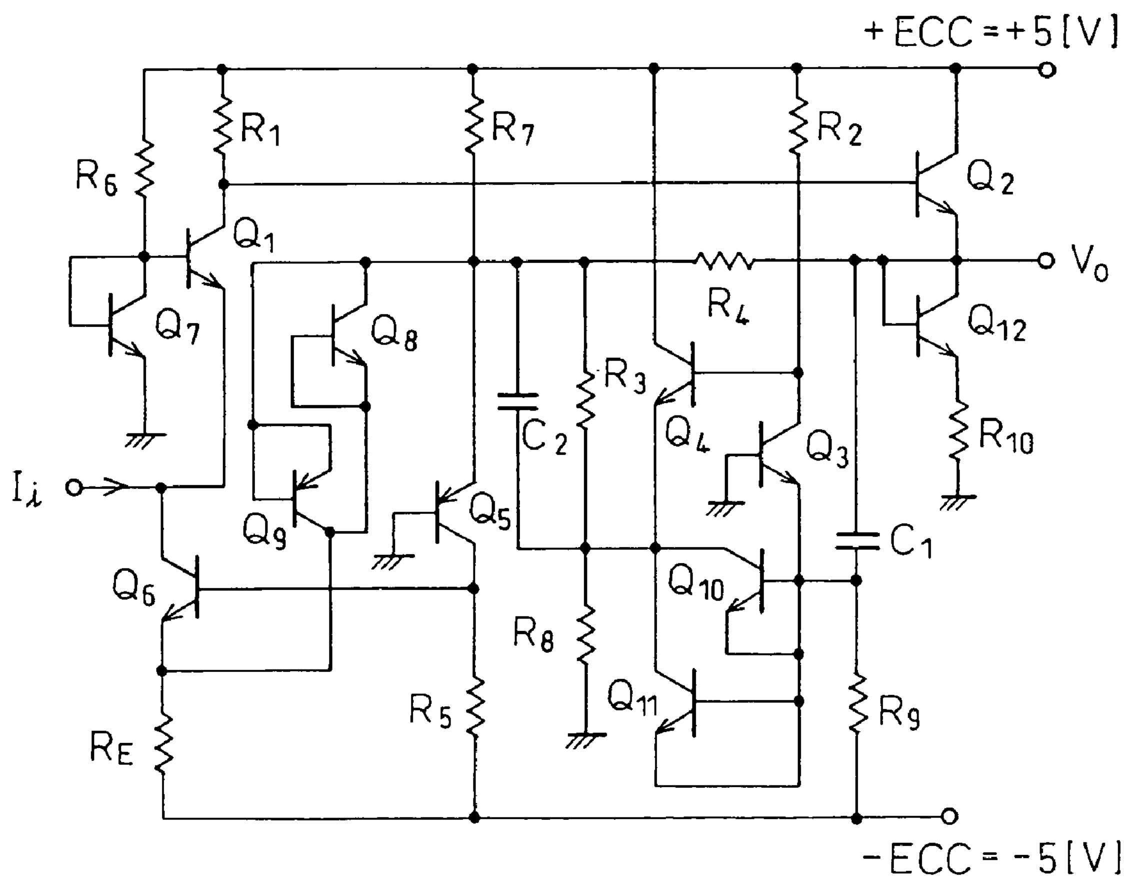
FIG. 9 is a block diagram showing a specific example of the second-order lowpass active RC filter circuit in FIG. 8.

FIG. 9 is a block diagram showing a specific example of the second-order lowpass active RC filter circuit in FIG. 8. This example was designed to obtain a maximally flat characteristic, under the following conditions:

$$Q^2=1/2$$

$$2(C_2/C_1)(R_3^2/R_2R_5)(R_E/R_1+R_5/R_4)=1 \quad (30)$$

In the second-order lowpass active RC filter circuit in FIG. 9, 2SC3501 and 2SA1206 were used as NPN bipolar transistors and PNP bipolar transistors, respectively. The respective values of capacitors and resistors were set as follows:

$C_1=C_2=35$ (pF)

$R_1=3.5$, $R_2=R_4=R_5=2$, $R_3=1.1$, $R_6=4.4$, $R_7=6.5$, $R_8=1.4$, $R_9=2.9$, $R_{10}=0.3$, $R_E=2.5$ (kO)

The second-order lowpass active RC filter circuit in FIG. 9 was designed to achieve the targets of cutoff frequency fc=3 MHz and "a"=2.4. The transistors $Q_8$, $Q_9$, $Q_{10}$ and $Q_{11}$ were connected as compensating capacitance.

Figure 10:
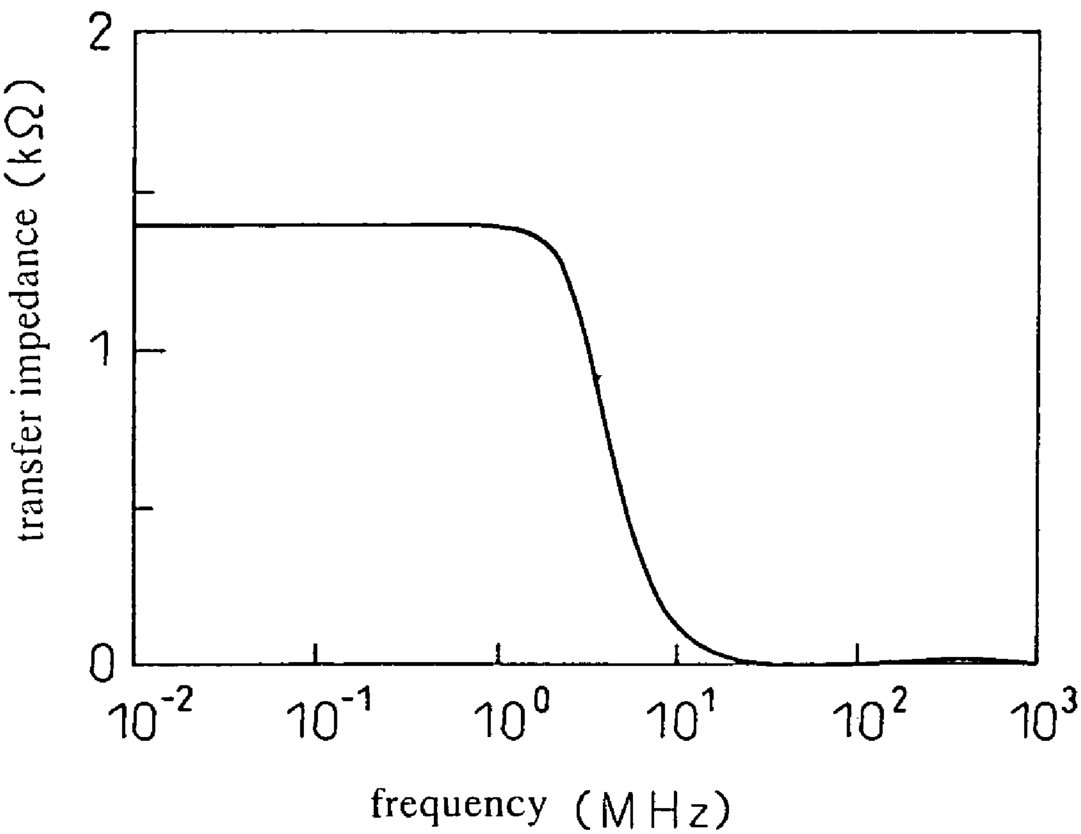
FIG. 10 is a graph showing a simulation result of the frequency-transfer impedance characteristic of the second-order lowpass active RC filter circuit in FIG. 9.

FIG. 10 shows a simulation result of the second-order lowpass active RC filter circuit designed to have the above values of the elements. As seen in FIG. 10, $|T(j|\omega_0)|$ is maintained below the forward gain R1=3.5 kO in the entire frequency range. In particular, the filter circuit exhibits a flat lowpass characteristic having an approximately constant gain of about 1.4 kO in a frequency range of 3 MHz or less.

Figure 11:
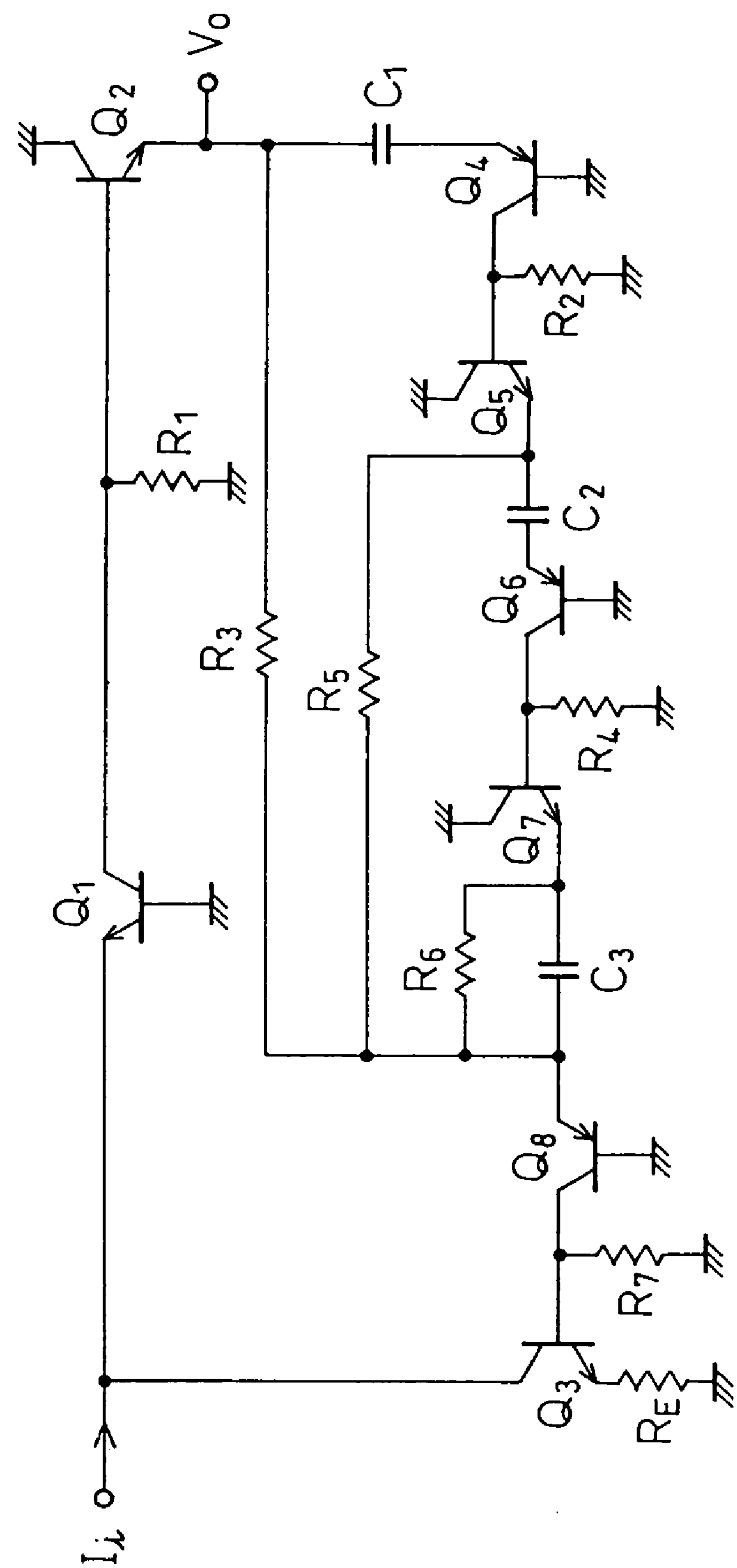
FIG. 11 is a basic block diagram showing a third-order lowpass active RC filter circuit according to the first embodiment.

The second-order lowpass active RC filter circuit in FIG. 8 can be extended to provide a higher-order filter circuit. FIG. 11 is a basic block diagram showing a lowpass active RC filter circuit extended to third order.

Specifically, the second-order lowpass active RC filter circuit in FIG. 8 is extended to a higher-order lowpass active RC filter circuit by providing a multistage-circuitry corresponding to the transmission function β(s) in the feedback section of the filter circuit in FIG. 8. The filter circuit in FIG. 11 is extended to third order by providing a two-stage circuitry related to the transmission function β(s). If the imperfection of transistors (collector capacitance or the like) is left out of consideration, the transfer function T(s) of the filter circuit can be expressed as follows:

$$\begin{aligned} T(s) &= Vo/Ii \\ &= R_1/[1+(R_1R_7/R_E)(1/R_3+ \\ &\quad sC_1R_2/R_5+s^2C_1C_2R_2R_4/R_6+s^3C_1C_2C_3R_2R_4)] \end{aligned} \quad (31)$$

The feedback section related to β(s) in the above third-order lowpass active RC filter circuit includes feedback resistor elements $R_3$, $R_5$ and $R_6$ which are connected to the emitter of a transistor $Q_8$ in a concentrated manner. While the basic block diagram in FIG. 11 is illustrated with a focus only on the AC components of a signal, and any DC bias lines are omitted therein, the feedback resistors connected to the emitter of a transistor $Q_8$ in a concentrated manner makes it difficult to layout the DC bias line in a practical circuit design.

Figure 12:
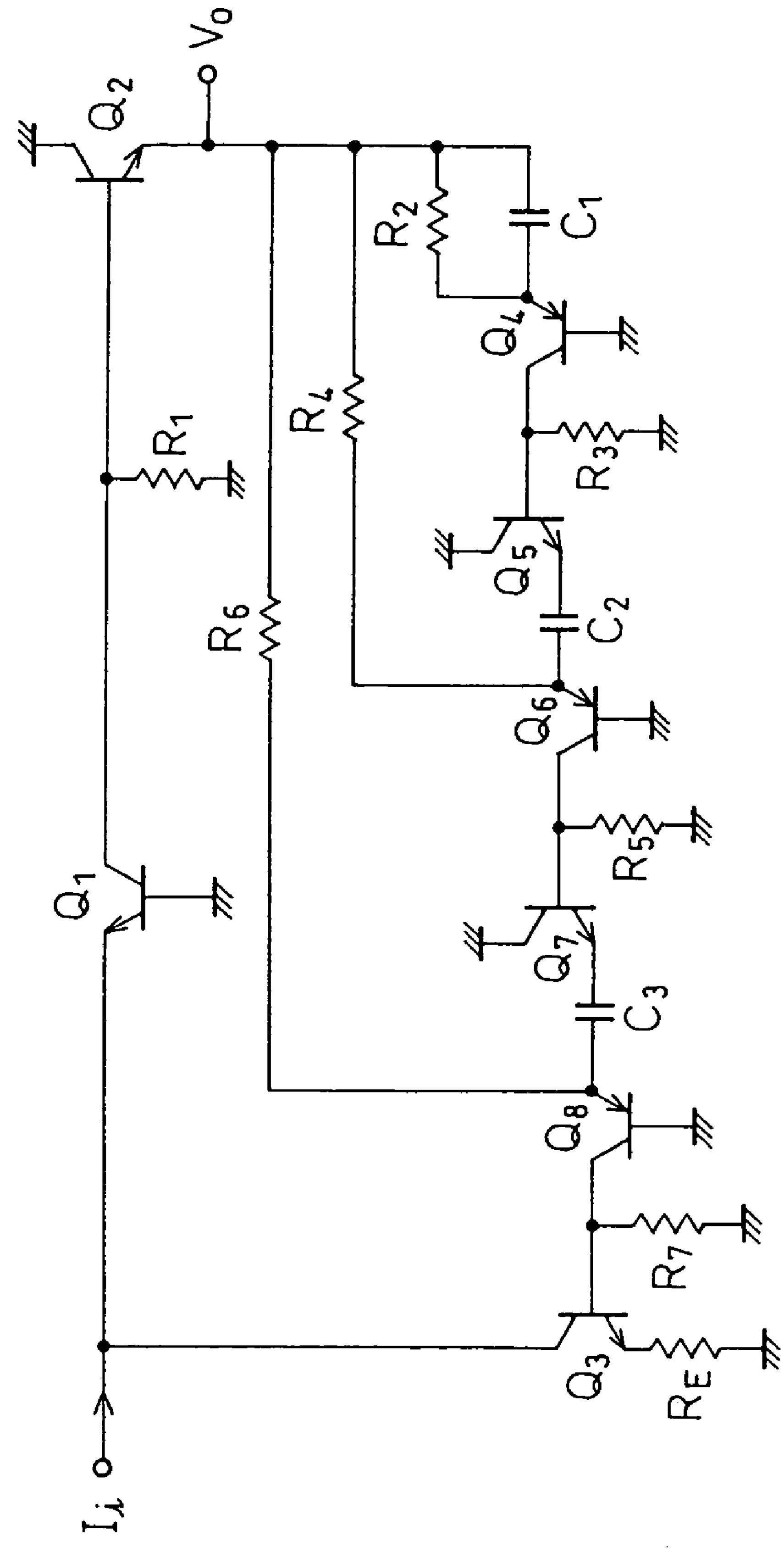
FIG. 12 is a basic block diagram showing another third-order lowpass active RC filter circuit according to the first embodiment.

FIG. 12 is a basic block diagram showing another third-order lowpass active RC filter circuit designed to prevent a plurality of feedback resistor elements from being connected to the emitter of the transistor $Q_8$ in a concentrated manner. In this filter circuit, instead of connecting feedback resistor elements $R_2$, $R_4$ and $R_6$ from the emitter of the transistor $Q_8$ to respective input sides in the feedback section related to β(s), they are connected from respective output sides to respective input sides in the feedback section related to β(s) or to the output side of the filter circuit, to allow the bias line for the emitter of the transistor $Q_8$ to be designed without difficulties.

The feedback section of this third-order lowpass active RC filter circuit has the following transmission function β(s):

$$\beta(s)=[(1/R_2+sC_1)sC_2R_3+1/R_4]sC_3R_5+1/R_6, \quad (32)$$

and the transfer function T(s) of the filter circuit is expressed as follows:

$$\begin{aligned} T(s) &= Vo/Ii \\ &= R_1/[1+(R_1R_7/R_E)(1/R_6+ \\ &\quad sC_3R_5/R_4+s^2C_2C_3R_3R_5/R_2+s^3C_1C_2C_3R_3R_5)] \end{aligned} \quad (33)$$

Given that a passband ripple $a_P=0.5$ dB, the transfer function T(s) of the third-order lowpass active RC filter circuit having a forward gain $R_1$ can be calculated as follows:

$$T(s)=R_1/[1+2.144625(j\omega/\omega c)+1.750624313(j\omega/\omega c)^2+1.39724329(j\omega/\omega c)^3] \quad (34)$$

Figure 13:
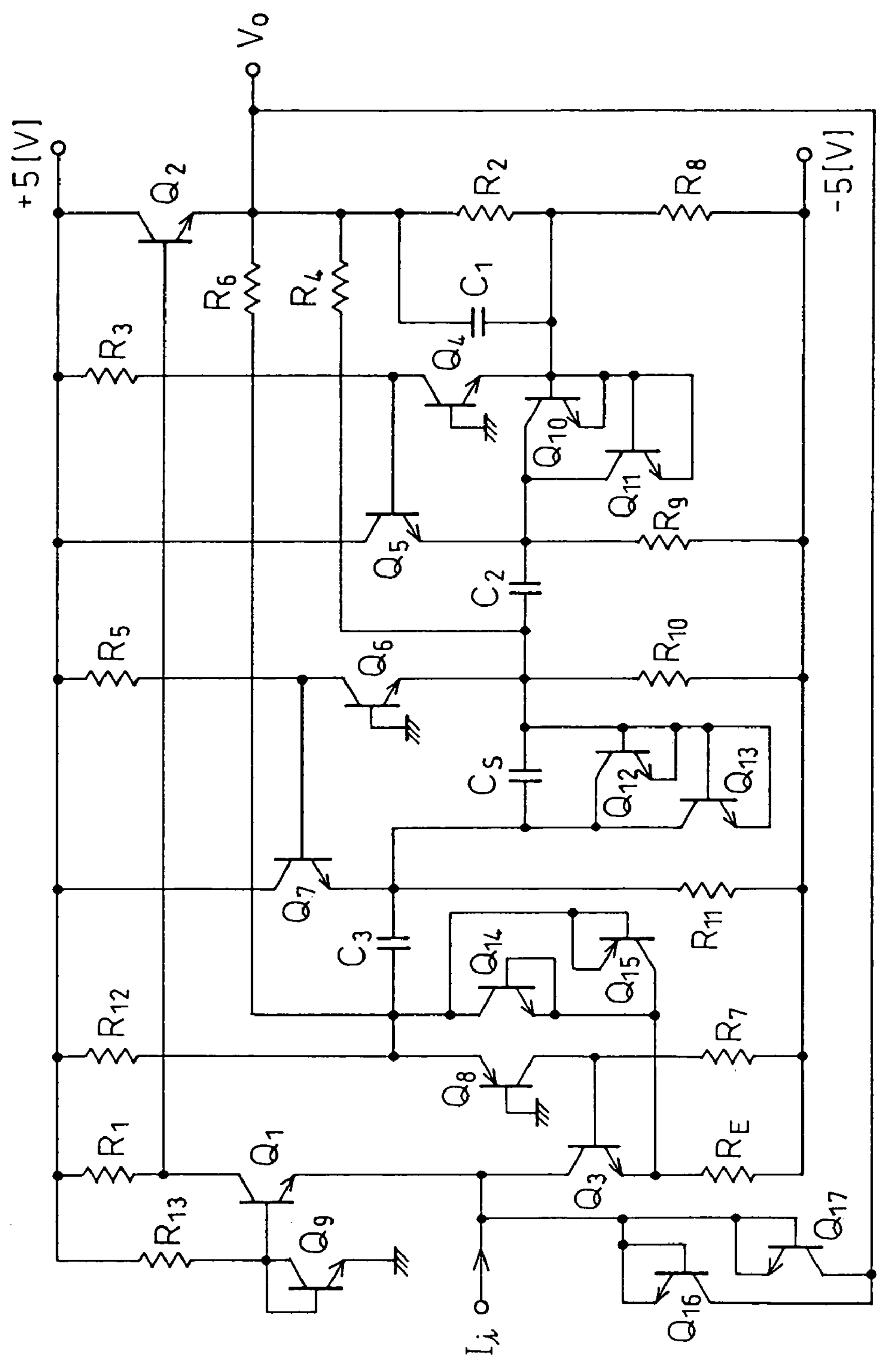
FIG. 13 is a block diagram showing a specific example of the third-order lowpass active RC filter circuit in FIG. 12.

FIG. 13 shows a specific example of this third-order lowpass active RC filter circuit. Various elements of this filter circuit were designed to achieve the targets of "a"=3 and cutoff frequency fc=5 MHz. In this filter circuit, 2SA1206 and 2SC3501 were used as PNP bipolar transistors and NPN bipolar transistors, respectively. The respective values of elements were set as follows:

Capacitor $C_1=15$, $C_2=C_3=40$, Cs=1 (pF)

Resistor $R_1=3.5$, $R_2=2$, $R_3=0.8$, $R_4=1.9$, $R_5=2.7$, $R_6=2.1$, $R_7=3$, $R_8=1$, $R_9=6.4$, $R_{10}=2.3$, $R_{11}=6.4$, $R_{12}=5$, $R_{13}=4.4$, $R_E=2.5$ (kO)

The collector capacitance of each pair of parallel transistors $Q_{10}$ and $Q_{11}$, $Q_{12}$ and $Q_{13}$, $Q_{14}$ and $Q_{15}$, and $Q_{16}$ and $Q_{17}$ acts to cancel and compensate the collector capacitance of each pair of parallel transistors $Q_4$ and $Q_5$, $Q_6$ and $Q_7$, $Q_8$ and $Q_3$, and $Q_1$ and $Q_2$.

Figure 14:
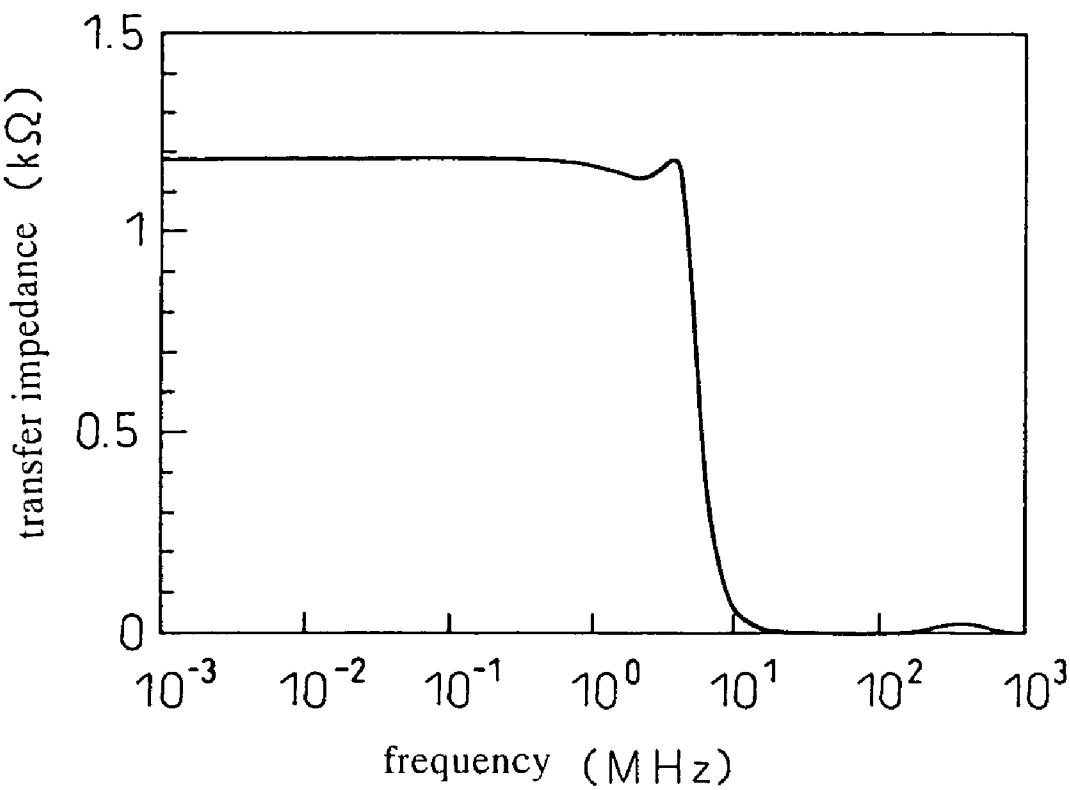
FIG. 14 is a graph showing a simulation result of the frequency-transfer impedance characteristic of the third-order lowpass active RC filter circuit in FIG. 13.

FIG. 14 shows a simulation result of the frequency-transfer impedance characteristic of the lowpass active RC filter circuit in FIG. 13. As seen in the result, the transfer impedance in a low frequency range is about 1.2 kO, or attenuated to 1/a of the forward gain R1=3.5 kO by the negative feedback. Further, the result clearly shows that the negative feedback is sufficiently applied over the entire frequency range.

While the simulation result in FIG. 14 was performed on the assumption of a temperature Ta=270° C., the same frequency-transfer impedance characteristic could also be obtained in the temperature range of 0 to 80° C. This shows that the filter circuit has stable characteristics to variation in temperature.

In the same manner as that described in connection with FIG. 6, noise coefficients $N_{Vk}$, $N_{IK}$ for the level of loop gain "a−1" could be calculated, and it was verified that an improved low-noise performance can be obtained by increasing the loop gain "a−1".

(Highpass Active RC Filter Circuit)

An input-output transfer impedance function T(s) for allowing the filter circuit in FIG. 2 to act as a second-order highpass RC filter is given as the following formula:

$$T(s)=1/[1+(\omega_P/s)Q+(\omega_P/s)^2] \tag{35}$$

However, considering a feedback loop for achieving this transfer function, when Q>1 in the formula (35), $|T(j|\omega_P)|$ becomes greater than 1 or the forward gain=1, and cannot satisfy the condition of the formula (2). Since this transfer function cannot achieve adequate negative feedback without modification, a constant "a" (a>1) is introduced into the denominator of the formula (35) to modify the formula (35) as follows:

$$\begin{aligned} T(s) &= 1/a[1+(\omega_P/s)/Q+(\omega_P/s)^2] \\ &= 1/[1+a-1+a(\omega_P/s)/Q+a(\omega_P/s)^2] \end{aligned} \tag{36}$$

Then, the level of a transmission gain of the filter circuit will be reduced by adjusting the negative feedback loop gain "$a-1+a(\omega_P/s)/Q+a(\omega_P/s)^2$", independently of the forward gain.

Figure 15:
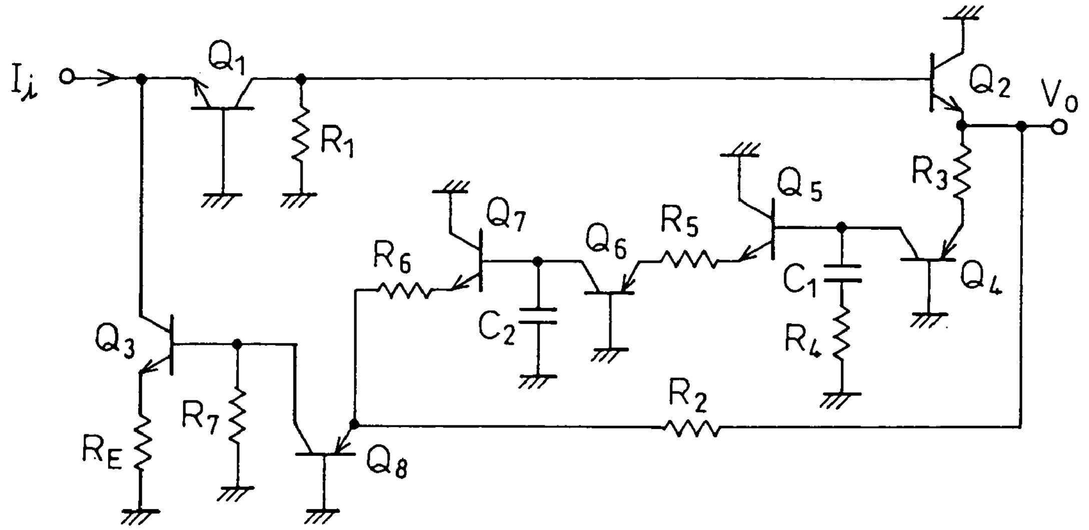
FIG. 15 is a basic block diagram showing a second-order highpass active RC filter circuit according to the first embodiment.

FIG. 15 is a basic block diagram showing a second-order highpass active RC filter circuit which comprises a feedforward section employing the aforementioned transistor-based CCVS, and a feedback section capable of obtaining the feedback loop gain in the formula (36). The transistor-based CCVS includes transistor $Q_1$ and $Q_2$, a resistor $R_1$. The feedback section includes transistors $Q_3$ to $Q_8$, capacitors $C_1$ and $C_2$, and resistors $R_2$ to $R_7$ and $R_E$.

The transmission function β(s) of the negative feedback section in this second-order highpass active RC filter circuit can be calculated by the following formula:

$$\beta(s)=(R_E/R_1)[a-1+a(\omega_P/s)/Q+a(\omega_P/s)^2] \tag{37}$$

Given that each of the transistors used in the filter circuit is an ideal element, the transfer function T(s) for the formula (36) is given as follows:

$$T(s)=R_1/[1+(R_1/R_2)(R_7/R_E)+(R_1R_4/s^3C_2R_3R_5R_6)(R_7/R_E)+(R_1/s^2C_1C_2R_3R_5R_6)(R_7/R_E)], \tag{38}$$

and polar angular frequency $\omega_P$, Q-value and value "a" are expressed as follows:

$$\omega_P^2=(R_1/C_1C_2R_3R_5R_6)/(R_1/R_2+R_E/R_7) \tag{39}$$

$$Q^2=[(C_2/C_1)(R_3R_5R_6/R_1R_4^2)(R_1/R_2+R_E/R_7) \tag{40}$$

$$a=1+(R_1/R_2)(R_7/R_E) \tag{41}$$

Figure 16:
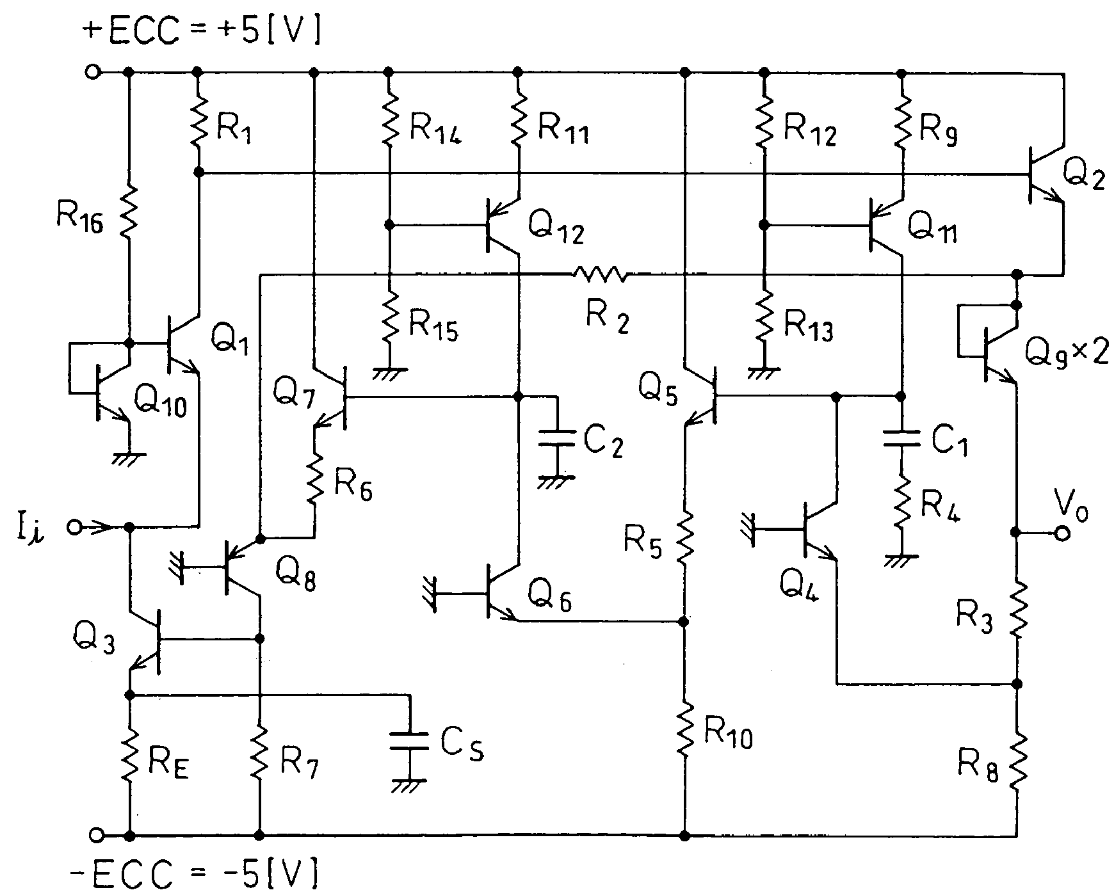
FIG. 16 is a block diagram showing a specific example of the second-order highpass active RC filter circuit in FIG. 15.

FIG. 16 shows a specific example of the highpass active RC filter circuit in FIG. 15, wherein DC bias lines are includes. This example was designed to obtain a maximally flat characteristic, under the following conditions:

$$Q^2=1/2$$

$$2(C_2/C_1)R_3R_5R_6/R_1R_4^2)(R_1/R_2+R_E/R_7)=1 \tag{42}$$

In this filter circuit in FIG. 9, 2SC3501 and 2SA1206 were used as NPN bipolar transistors and PNP bipolar transistors, respectively. The respective values of elements were set as follows:

Capacitor $C_1$=234, $C_2$=240 (pF)

Resistor $R_1$=$R_4$=3.2, $R_2$=$R_3$=$R_9$=$R_{11}$=0.6, $R_5$=2.6, $R_6$=1.4, $R_7$=0.8, $R_8$=$R_{10}$=2.2, $R_{12}$=$R_{14}$=1.2, $R_{13}$=$R_{15}$=3.8, $R_E$=1.0 (kO)

Figure 17:
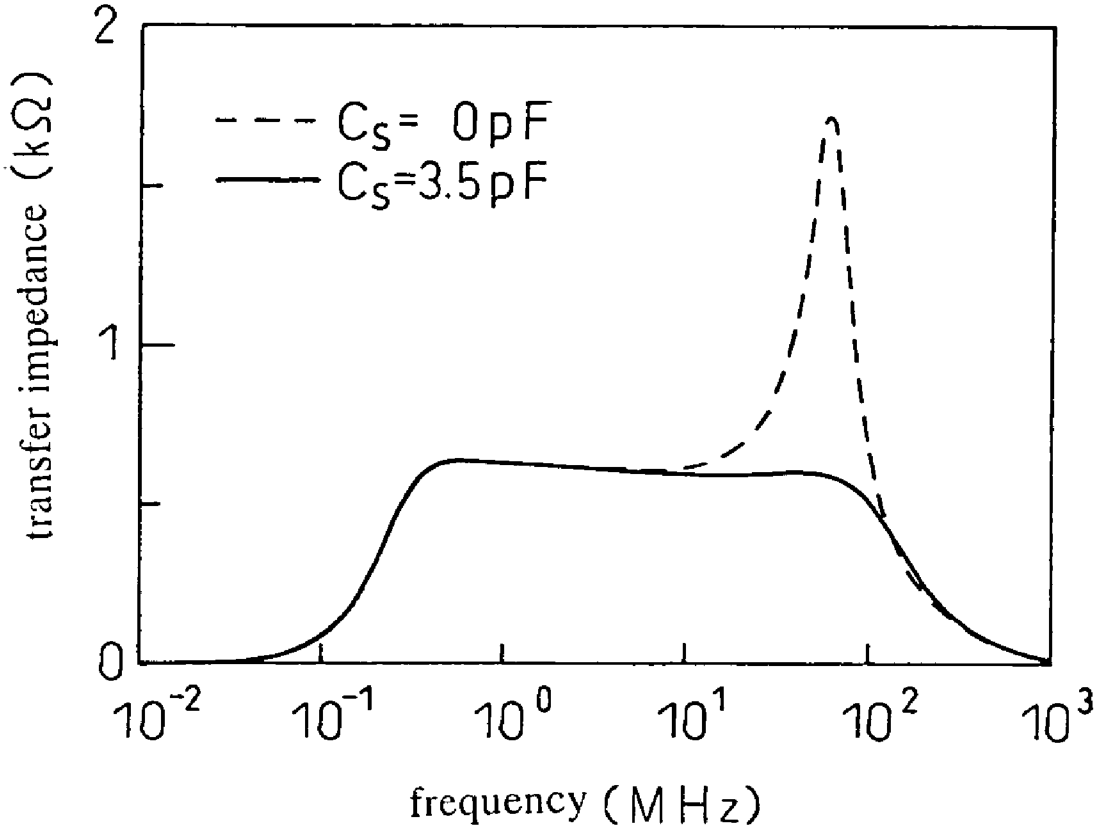
FIG. 17 is a graph showing a simulation result of the frequency-transfer impedance characteristic of the second-order highpass active RC filter circuit in FIG. 16.

FIG. 17 shows a simulation result of the frequency-transfer impedance characteristic of the highpass active RC filter circuit in FIG. 16. In this figure, while the transfer impedance is reduced in 100 MHz or more, this is caused by high-frequency characteristics of the transistors themselves. Further, the characteristic indicated by a dotted line is caused by the influence of parasitic transistors. In order to eliminate this influence, the highpass active RC filter circuit in FIG. 16 includes a capacitor Cs (3.5 pF) inserted into the emitter of a transistor $Q_3$. The characteristic after inserting the capacitor Cs is shown by the solid line in FIG. 17. This curve shows that the highpass active RC filter circuit has a flat characteristic.

In the same manner as that described in connection with FIG. 6, noise coefficients $N_{Vk}$, $N_{IK}$ for the level of loop gain "a−1" could be calculated, and it was verified that an improved low-noise performance can be obtained by increasing the loop gain "a−1".

An example in which the second-order highpass active RC filter circuit in FIG. 15 is extended to higher order will be described below. This higher-order highpass active RC filter circuit can be obtained in the same manner as that in the aforementioned lowpass active RC filter circuit, and the transfer impedance function β(s) in the formula (37) can be achieved by providing a multistage-connection of integration circuits in the feedback section of the highpass active RC filter circuit.

Figure 18:
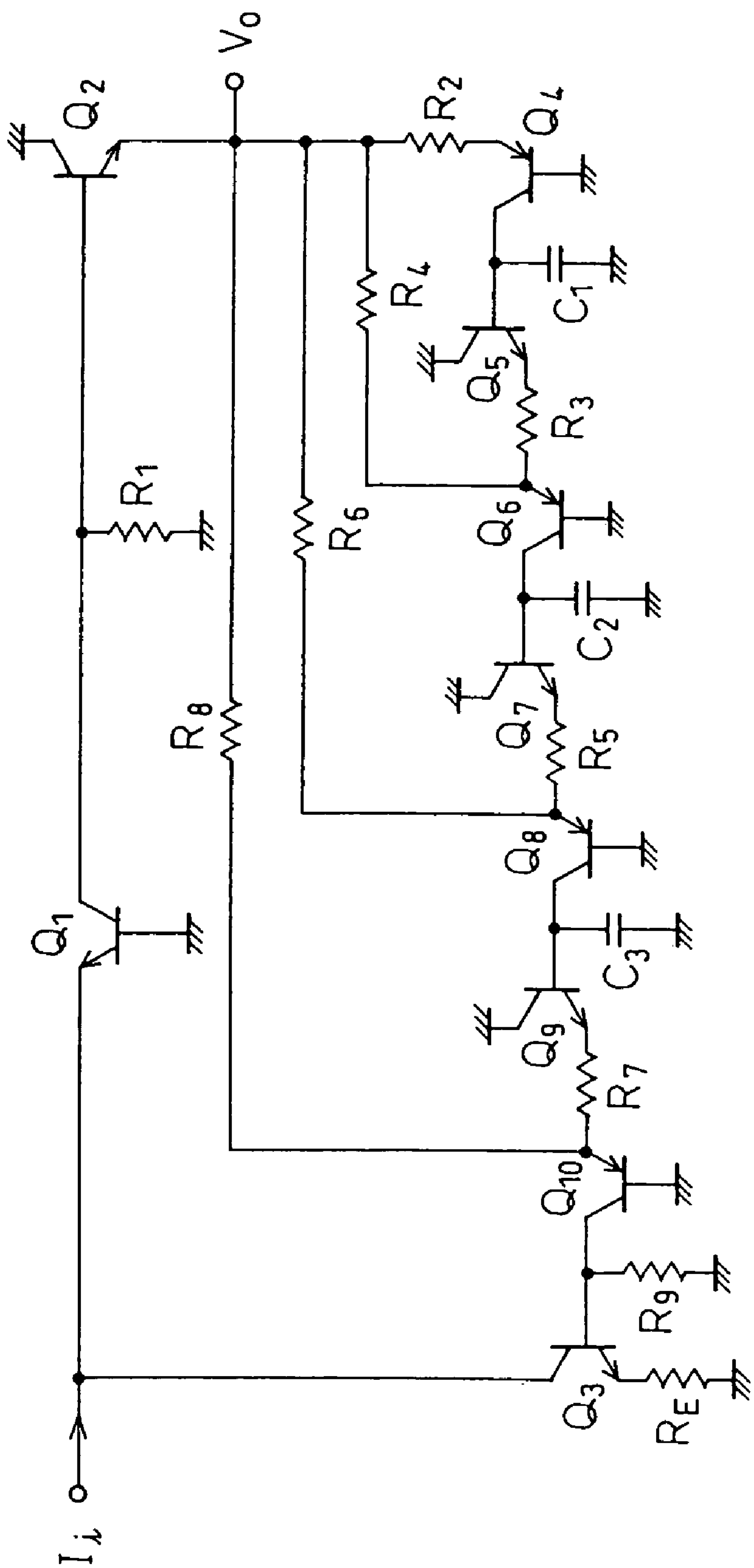
FIG. 18 is a basic block diagram showing a third-order highpass active RC filter circuit modified from the second-order highpass active RC filter circuit in FIG. 15.

As an example, FIG. 18 is a basic block diagram showing a third-order highpass active RC filter circuit obtained by extending the second-order highpass active RC filter circuit. In the third-order highpass active RC filter circuit, feedback resistors $R_4$, $R_6$ and $R_8$ is arranged such that they are not connected to a transistor $Q_{10}$ in a concentrated manner. The reason is the same as that in the aforementioned lowpass active RC filter circuit.

The transfer function T(s) of the third-order highpass active RC filter circuit can be calculated by the following formula:

$$T(s) = Vo/Ii = R_1/[1+(R_1R_9/R_E)\{(1/S^2C_1C_2R_2R_3R_5 + 1/sC_2R_4R_5 + 1/R_6)/sC_3R_7 + 1/R_8\}] \quad (43)$$

Given that a passband ripple $a_P$=0.5 dB, the transfer function T(s) of the third-order highpass active RC filter circuit having a forward gain $R_1$ can be calculated as follows:

$$T(s)=R_1/[1.39724329(\omega c/j\omega)^3+1.750624313(\omega c/j\omega)^2+2.144625(\omega c/j\omega)+1] \quad (44)$$

Figure 19:
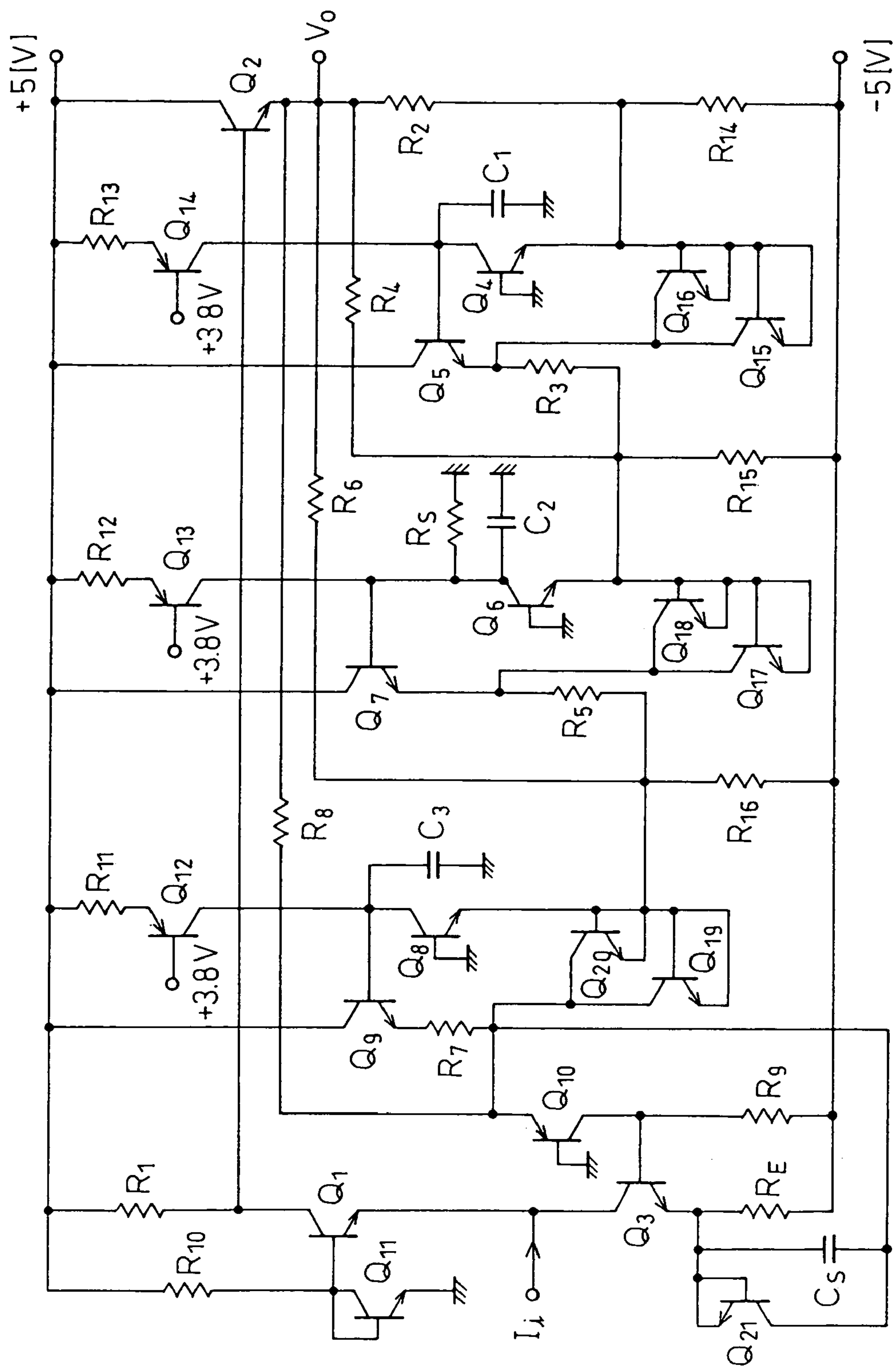
FIG. 19 is a block diagram showing a specific example of the third-order highpass active RC filter circuit in FIG. 18.

FIG. 19 shows a specific example of the third-order highpass active RC filter circuit in FIG. 18. Various elements of this filter circuit were designed to achieve the targets of "a"=4 and cutoff frequency fc=300 kHz. In this filter circuit, 2SA1206 and 2SC3501 were used as PNP bipolar transistors and NPN bipolar transistors, respectively. The respective values of elements were set as follows:

Capacitor $C_1=C_2=C_3$=90, Cs=1 (pF)

Resistor $R_1=R_2$=3.5, $R_3$=3.4, $R_4=R_{15}$=1.9, $R_5$=3, $R_6$=0.9, $R_7$=2, $R_8$=1, $R_9$=2.2, $R_{10}$=4.4, $R_{11}$=1.2, $R_{12}=R_{13}$=0.6, $R_{14}$=3.2, $R_{15}$=1.8, $R_{16}$=1.4, $R_E$=2.5 (kO)

Each of transistors $Q_{15}$ and $Q_{16}$, $Q_{17}$ and $Q_{18}$, $Q_{19}$ and $Q_{20}$, and $Q_{21}$ acts as compensating capacitance to cancel the collector capacitance of each of transistors $Q_4$ and $Q_5$, $Q_6$ and $Q_7$, $Q_8$ and $Q_9$, and $Q_{10}$ and $Q_3$.

Figure 20:
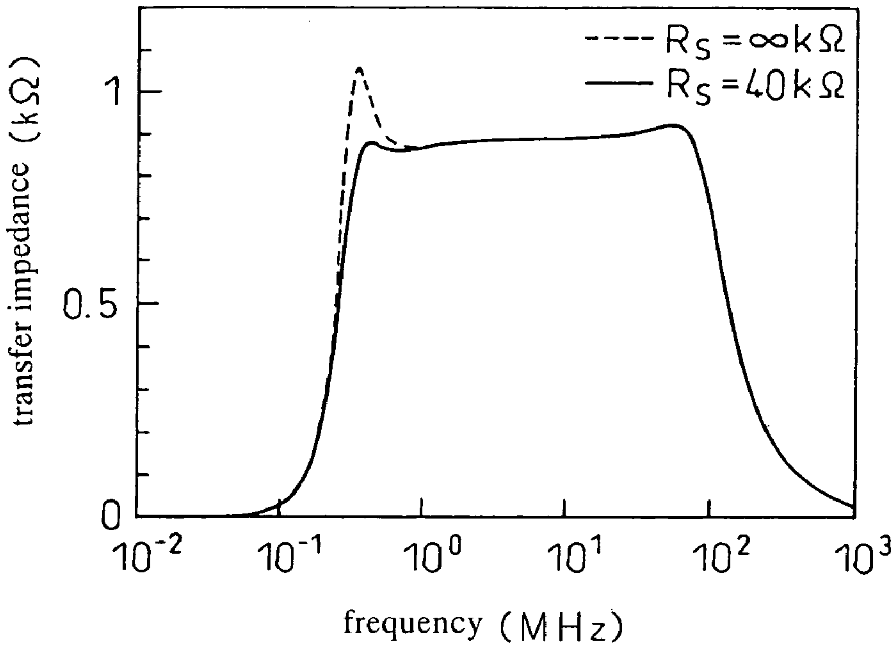
FIG. 20 is a graph showing a simulation result of the frequency-transfer impedance characteristic of the third-order highpass active RC filter circuit in FIG. 19.

FIG. 20 shows a simulation result of the frequency-transfer impedance characteristic of the third-order highpass active RC filter circuit in FIG. 19. The resistor Rs (40 kO) connected in parallel with the capacitor $C_2$ can suppress the peak in a low frequency range as indicated by the dotted line in FIG. 20 to provide a third-order highpass active RC filter circuit having a flat frequency-transfer impedance characteristic as indicated by the solid line. The attenuation in a high frequency range in this characteristic is caused by high-frequency characteristics of the transistors themselves.

As seen in the result, the transfer impedance in a low frequency range is about 1.2 kO, or attenuated to 1/a of the forward gain R1=3.5 kO by the negative feedback. Further, the result clearly shows that the negative feedback is sufficiently applied over the entire frequency range.

Second Embodiment

In the first embodiment, the filter circuit comprises the feedforward section employing the transistor-based CCVS, and the feedback section, wherein the transfer impedance function of the feedback section allowing the transfer function of the filter circuit to satisfy the formula (2) is selected to change a negative feedback loop gain such that a transmission gain is reduced at a value equal to or less than a forward gain over the entire frequency range.

In a second embodiment, an op-amp-based negative-phase-sequence CCVS is used as a substitute for the transistor-based CCVS, and a negative feedback loop gain is changed such that a transmission gain is reduced at a value equal to or less than a forward gain over the entire frequency range. Further, the loop gain is increased over the entire frequency range to facilitate noise reduction in a signal processing circuit.

Figure 21:
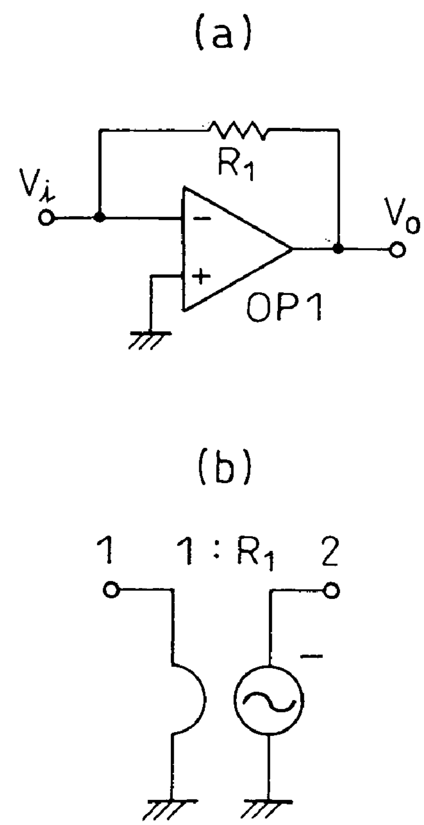
FIG. 21 is an explanatory view of an OP-Amp-based negative-phase-sequence current controlled voltage source.

FIG. 21(*a*) shows the structure of an op-amp-based negative-phase-sequence CCVS. Fundamentally, the negative-phase sequence CCVS comprises an operational amplifier $OP_1$, and a resistor $R_1$ connected between the inverting input side and the output side of the operational amplifier $OP_1$. If the finite GB product of the operational amplifier $OP_1$ is left out of consideration, an equivalent circuit as shown in FIG. 21(*b*) can be obtained. An input signal is supplied to the inverting input of the operational amplifier $OP_1$, and thus a corresponding output has a reverse phase to that of the input signal, and the resistor $R_1$ serves as an impedance for current-voltage conversion. The operational amplifier can be composed of a MOS transistor.

An active RC filter circuit provided using an op-amp-based negative-phase-sequence CCVS and having a transfer function to be changed such that it a transmission gain is reduced at a value equal to or less than a forward gain while satisfying the aforementioned formula (2) to provide a desired frequency characteristic will be described below in connection with respective examples of a bandpass filter circuit, a lowpass filter circuit and a highpass filter circuit.

(Bandpass Active RC Filter Circuit)

Figure 22:
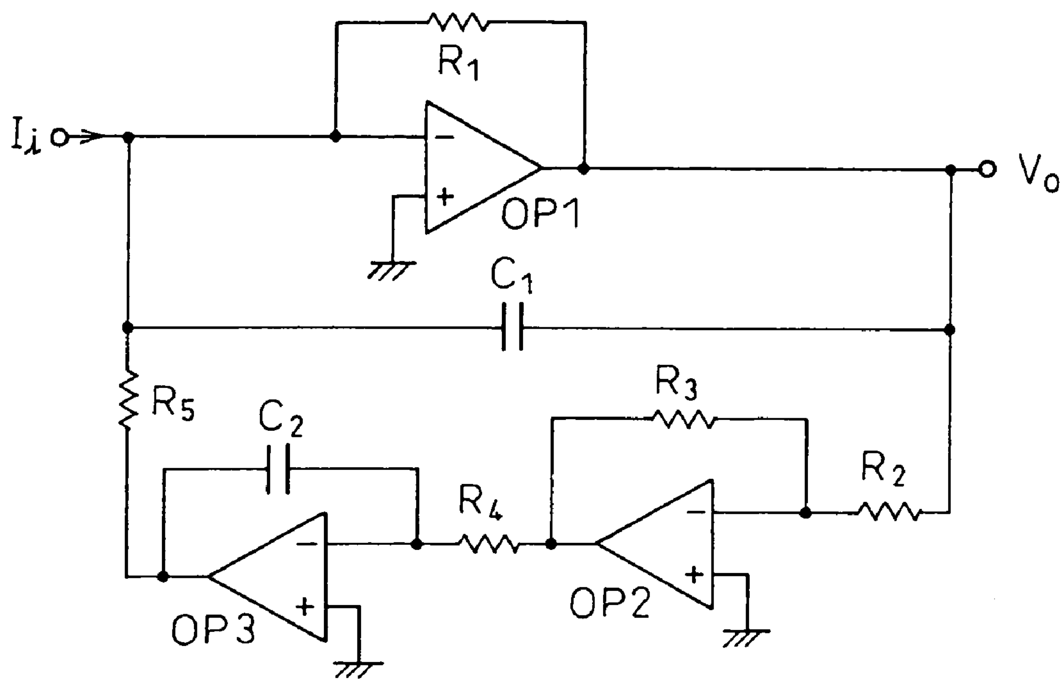
FIG. 22 is a basic block diagram showing a second-order bandpass active RC filter circuit according to a second embodiment of the present invention, wherein a negative-phase-sequence current controlled voltage source is used in a feedforward section.

FIG. 22 shows a negative-feedback type second-order bandpass active RC filter circuit using an op-amp-based negative-phase-sequence CCVS. The circuit in FIG. 21(*a*) is directly used as the negative-phase-sequence CCVS. The filter circuit comprises a negative feedback section connected between the input and output sides of the negative-phase-sequence CCVS. The negative feedback section includes operational amplifiers $OP_2$ and $OP_3$, capacitors $C_1$ and $C_2$, and resistors $R_2$ to $R_5$.

Given that each of the operational amplifiers $OP_1$ to $OP_3$ are an ideal element with disregard to the finite GB product thereof, the transfer impedance function $Z_T$ is Vo/Ii. Thus, the following formula can be obtained:

$$Z_T=-R_1/[1+R_1(sC_1+R_3/sC_2R_2R_4R_5)] \quad (45)$$

The center angular frequency $\omega_0$ and Q-value are also obtained as follows:

$$\omega_0=(R_3/C_1C_2R_2R_4R_5)^{1/2} \quad (46)$$

$$Q = R_1(C_1R_3/C_2R_2R_4R_5)^{\frac{1}{2}} = \omega_0R_1C_1 \quad (47)$$

Figure 23:
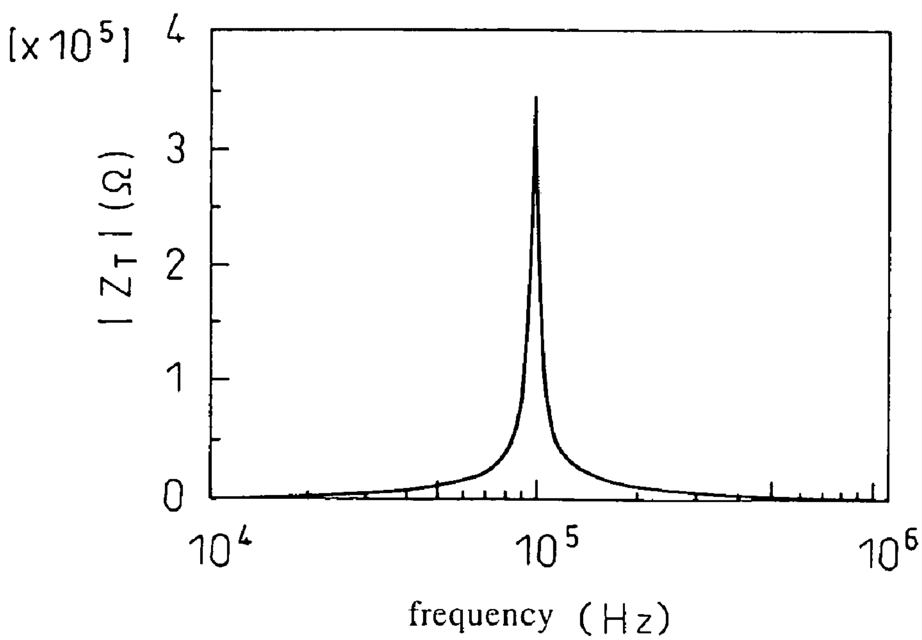
FIG. 23 is a graph showing a simulation result of the frequency-transfer impedance characteristic of the second-order bandpass active RC filter circuit in FIG. 22.

The characteristic of the second-order bandpass active RC filter circuit in FIG. 22 was simulated by assigning specific numerical values to the elements thereof. FIG. 23 shows a frequency-transfer impedance characteristic obtained as a simulation result. The filter circuit was designed to achieve the targets of center frequency $f_0$=100 kHz and Q-value=10. LF 356 (GB=5 MHz: available from National Semiconductor Corp.) was used as the operational amplifiers. The values of the capacitors and registers were set as follows:

$C_1$=100, $C_2$=10 (pF)

$R_1$=150, $R_2=R_3=R_4=R_5$=50 (kO)

In FIG. 23 as the simulation result, the filter circuit has a center frequency $f_0$=94 kHz, and a Q-value=21. The deviation between the target value and the result is caused by the finite GB product of the operational amplifiers.

As apparent from the formula (46), no negative feedback is formed even at the center frequency $f_0$. Further, as seen in FIG. 23, the transfer impedance at the center frequency $f_0$ is about 350 kO, which is far greater than $R_1$=150 kO. This means that the second-order bandpass active RC filter circuit in FIG. 22 cannot satisfy the condition of the formula (2), or cannot maintain negative feedback at the center frequency $f_0$, without modification.

$$\omega_0 = \sqrt{\frac{R_3}{C_1 C_2 R_2 R_4 R_6}} \tag{50}$$

$$Q = \frac{R_1}{R_2 R_4 R_6 + R_1 R_3 R_5}\sqrt{\frac{C_1 R_2 R_3 R_4 R_6}{C_2}} \tag{51}$$

The transfer impedance $Z_T$ of the filter circuit determined based on the formula (48) by taking account of the respective finite GB products $GB_1$ to $GB_3$ of the operational amplifiers $OP_1$ to $OP_3$ is expressed as follows:

$$\begin{aligned} Z_T &= \frac{V_0}{I_i} \\ &= -\frac{R_1}{1 + \left(1 + \frac{R_1}{R_6}\right)\frac{s}{GB_1} + \frac{sC_1 R_1}{1 + sC_1 R_5}\left(1 + \frac{s}{GB_1}\right) + \frac{\frac{R_3}{R_2}\cdot\frac{R_1(1 + sC_5 R_6)}{R_6}\left(\frac{R_5}{R_4} + \frac{1}{sC_2 R_4}\right)}{\left[1 + \frac{s}{GB_2}\left(1 + \frac{R_3}{R_2}\right)\right]\cdot\left[1 + \frac{s}{GB_3}\left(1 + \frac{R_5}{R_4} + \frac{1}{sC_2 R_4}\right)\right]}} \end{aligned} \tag{52}$$

Figure 24:
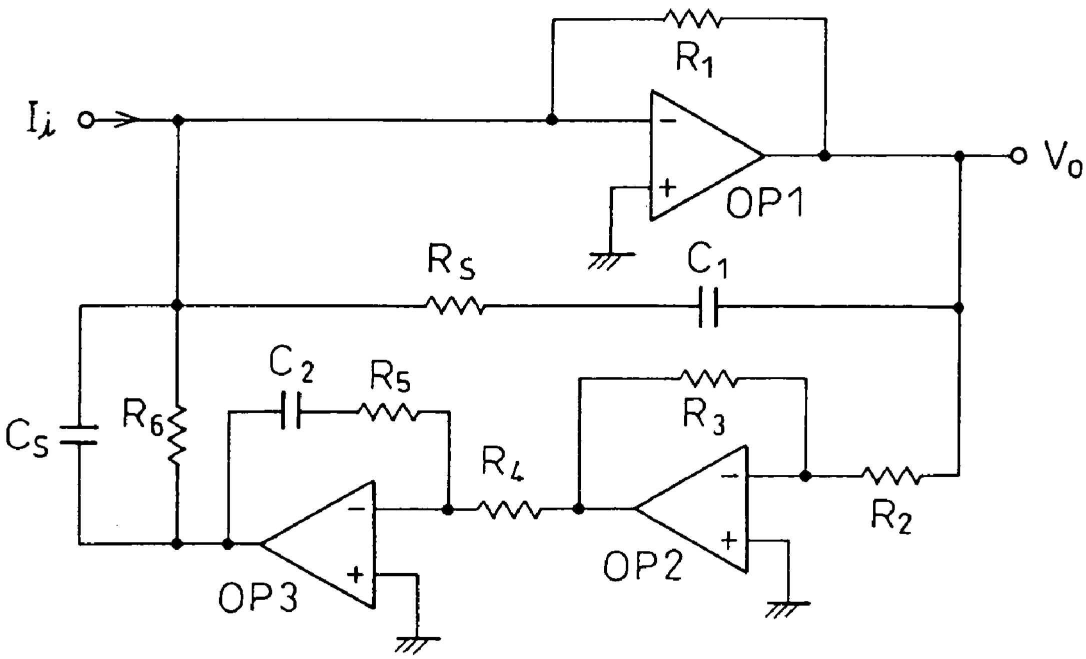
FIG. 24 is a block diagram a specific example of the second-order bandpass active RC filter circuit in FIG. 22, wherein the example is configured to cancel the influence of a GB (Gain Band width) product.

FIG. 24 shows a modified second-order bandpass active RC filter circuit capable of increasing a negative feedback amount to satisfy the conditions of the formula (2) over the entire frequency range including the center frequency $f_0$ so as to facilitate the reduction of gain level. The second-order bandpass active RC filter circuit in FIG. 24 has the same fundamental structure as that of the filter circuit in FIG. 22, except for a resistor $R_5$ inserted in series with the capacitor $C_2$ in the feedback section of the operational amplifier $P_3$, and a resistor Rs connected in series with the capacitor $C_1$, and a capacitor Cs connected in parallel with the resistor $R_6$.

Given that each of the operational amplifiers $OP_1$ to $OP_3$ is an ideal element, the transfer impedance function $Z_T$ of the filter circuit is expressed as follows:

$$Z_T = \frac{V_0}{I_i} = \frac{R_1}{\left(1 + R_1\cdot\frac{R_3}{R_2}\cdot\frac{R_5}{R_4 R_6}\right)\cdot\left[1 + \frac{R_1}{1 + R_1\cdot\frac{R_3}{R_2}\cdot\frac{R_5}{R_4 R_6}}\cdot\left(sC_1 + \frac{1}{sC_2}\cdot\frac{R_3}{R_2}\cdot\frac{1}{R_4 R_6}\right)\right]} \tag{48}$$

In this case, the constant "a" is expressed as follows:

$$a = 1 + R_1\cdot\frac{R_3}{R_2}\cdot\frac{R_5}{R_4 R_6} \tag{49}$$

Further, the center angular frequency $\omega_0$ and the Q-value are expressed as follows:

The resistor Rs and the capacitor Cs are used as compensating elements for cancelling the influence of the GB products.

With the targets of "a"=2.2, center frequency $f_0$=100 kHz and Q-value=10, the characteristic of the filter circuit was simulated by assigning the following values to the elements.

Capacitor $C_1$=150, $C_2$=85, Cs=1 (pF)

Resistor $R_1$=200, $R_2$=10, $R_3$=150, $R_4$=$R_6$=50, $R_5$=1 (kO), Rs=80 O

LF 357 (GB=15 MHz: available from National Semiconductor Corp.) was used as the operational amplifiers $OP_1$ to $OP_3$.

Figure 25:
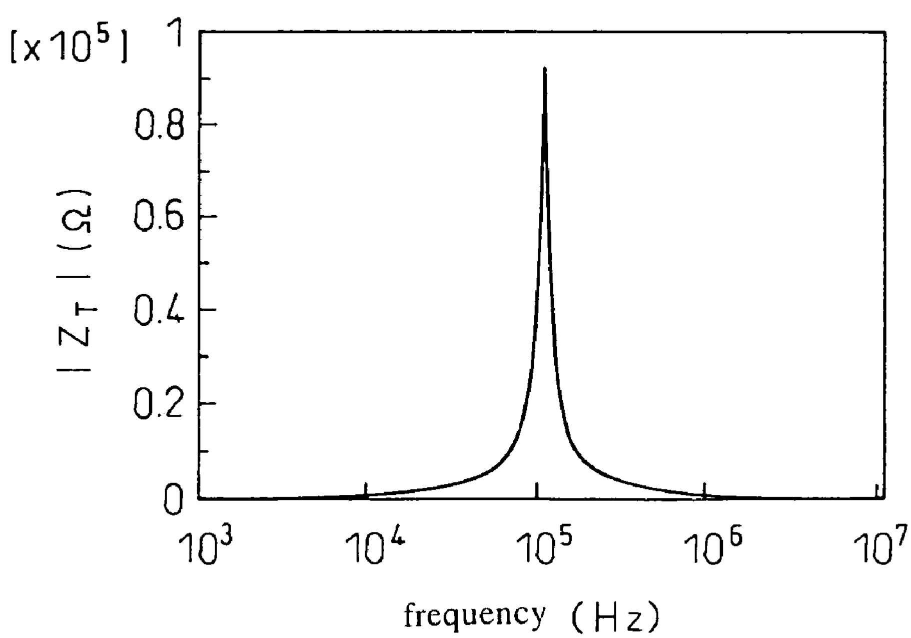
FIG. 25 is a graph showing a simulation result of the frequency-transfer impedance characteristic of the second-order bandpass active RC filter circuit in FIG. 24.

FIG. 25 shows a simulation result of the frequency-transfer impedance characteristic of the second-order bandpass active RC filter circuit having the elements arranged as above. According to this result, the filter circuit has a center frequency $F_0$=109 kHz and a Q-value=9.5 which well match with the targets. Further, the transfer impedance at center frequency $F_0$ is about 95 kO which is less than the transfer impedance $R_1$=200 kO of the feedforward section. This shows that the second-order bandpass active RC filter circuit in FIG. 24 satisfies the condition of the formula (2), and the negative feedback is sufficiently applied thereto over the entire frequency range.

(Lowpass Active RC Filter Circuit)

A conventional lowpass filter using bipolar transistors has employed a multistage differentiation circuit in a feedback section thereof. In a second-order lowpass active RC filter circuit using a negative-phase-sequence CCVS based on an operational amplifier $OP_1$, a frequency-dependent voltage follower composed of an operational amplifier and a multistage-RC integration circuit is used in a feedback section.

Figure 26:
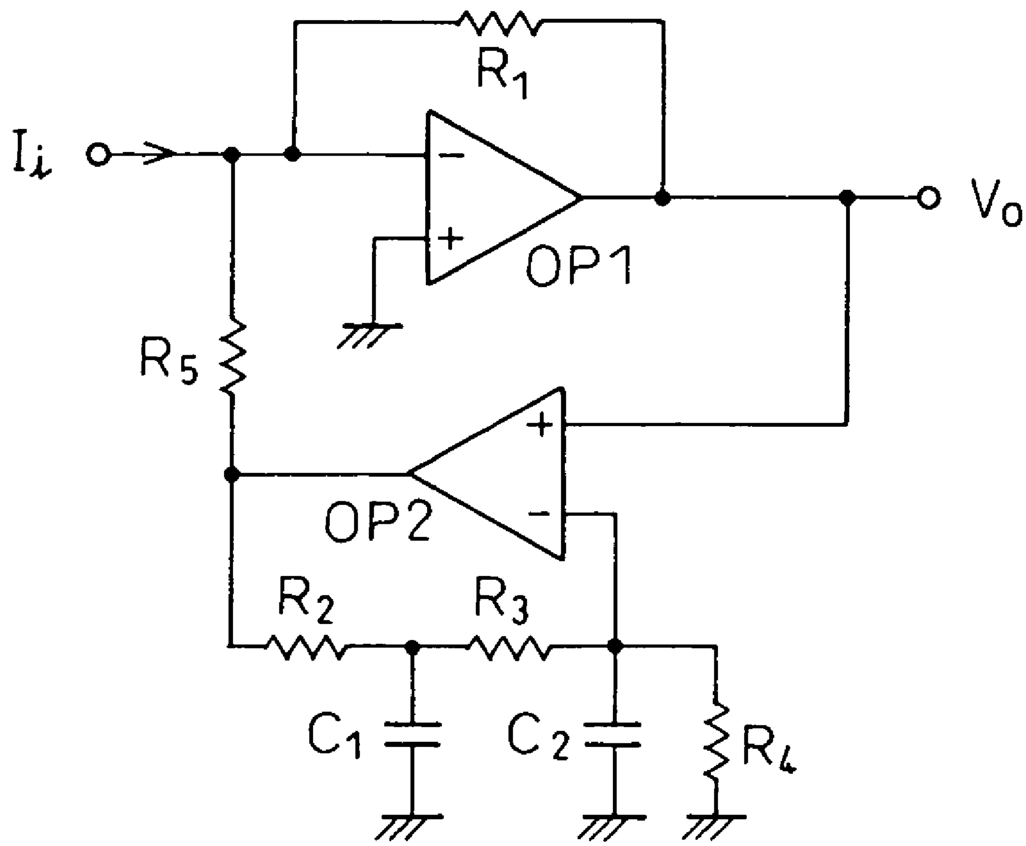
FIG. 26 is a block diagram showing a second-order lowpass active RC filter circuit according to the second embodiment

FIG. 26 shows the structure of the above second-order lowpass active RC filter circuit. In this filter circuit, the negative-phase-sequence CCVS based on the operational amplifier $OP_1$ is interposed between the input and output of a feedforward section thereof, and the multistage-RC integration circuit including capacitors $C_1$, $C_2$, and resistor $R_2$, $R_3$ is connected between the inverting input side and the output side of an operational amplifier $OP_2$ in a feedback section thereof.

Given that each of the operational amplifiers is an ideal element, the output voltage V of the operational amplifier $OP_2$ is expressed as follows:

$$V=Vo[(R_2+R_3+R_4)/R_4+s[C_2(R_2+R_3)+C_1(R_3+R_4)(R_2/R_4)]+s^2C_1C_2R_2R_3] \quad (53)$$

As seen from the formula (53), it is noted that the multistage ladder connection composed of the capacitors $C_1$, $C_2$, and resistor $R_2$, $R_3$ in FIG. 26 provides an "s" polynomial equation for feedback transmission.

The transfer impedance function $Z_T$ of the second-order lowpass active RC filter circuit in FIG. 26 is expressed as follows:

$$Z_T = \frac{V_0}{I_i} = \frac{R_1}{1+\frac{R_1}{R_5}\cdot\frac{R_2+R_3+R_4}{R_5}+s\frac{R_1}{R_5}\left[C_2(R_2+R_3)+\frac{C_1R_2}{R_4}(R_3+R_4)\right]+s^2\frac{C_1C_2R_1R_2R_3}{R_5}} \quad (54)$$

The constant "a", the center angular frequency $\omega_0$ and the Q-value are expressed as follows:

$$a = 1+\frac{R_1}{R_5}\cdot\frac{R_2+R_3+R_4}{R_4} \quad (55)$$

$$\omega_P = \sqrt{\frac{1+\frac{R_2+R_3}{R_4}+\frac{R_5}{R_1}}{C_1C_2R_2R_3}} \quad (56)$$

$$Q = \frac{\sqrt{C_1C_2R_2R_3\left(1+\frac{R_5}{R_1}+\frac{R_2+R_3}{R_4}\right)}}{C_2(R_2+R_3)+C_1R_2\left(1+\frac{R_3}{R_4}\right)} \quad (57)$$

The transfer impedance function $Z_T(s)$ of the second-order lowpass active RC filter circuit determined based on the formula (54) by taking account of the respective finite GB products $GB_1$ to $GB_3$ of the operational amplifiers $OP_1$ to $OP_3$ is expressed as follows:

$$Z_T(s)=-R_1/[1+s/GB_1(1+R_1/R_5)+(R_1/R_5)/(A+s/GB_2)] \quad (58)$$

$$\text{wherein } A=1/[1+(R_2+R_3)/R_4+s[(R_2+R_3)C_3+R_2R_3C_2/R_4]+s^2C_2C_3R_2R_3] \quad (59)$$

With the targets of "a"=1.6, cutoff frequency $f_P$=100 kHz and Q-value=0.72, the characteristic of the second-order lowpass active RC filter circuit in FIG. 26 was simulated by assigning the following values to the elements.

Capacitor $C_1$=$C_2$=195 (pF)

Resistor $R_1$=50, $R_2$=$R_3$=25, $R_4$=20, R5=300 (kO)

Figure 27:
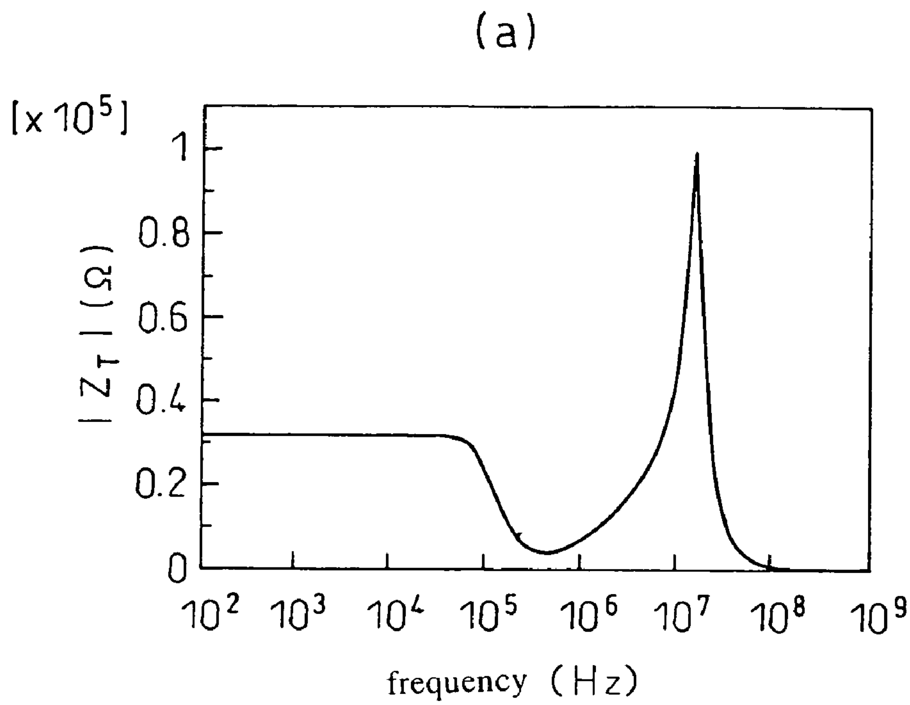
FIG. 27 is a graph showing a simulation result of the frequency-transfer impedance characteristic of the second-order lowpass active RC filter circuit in FIG. 26.
Figure 27:
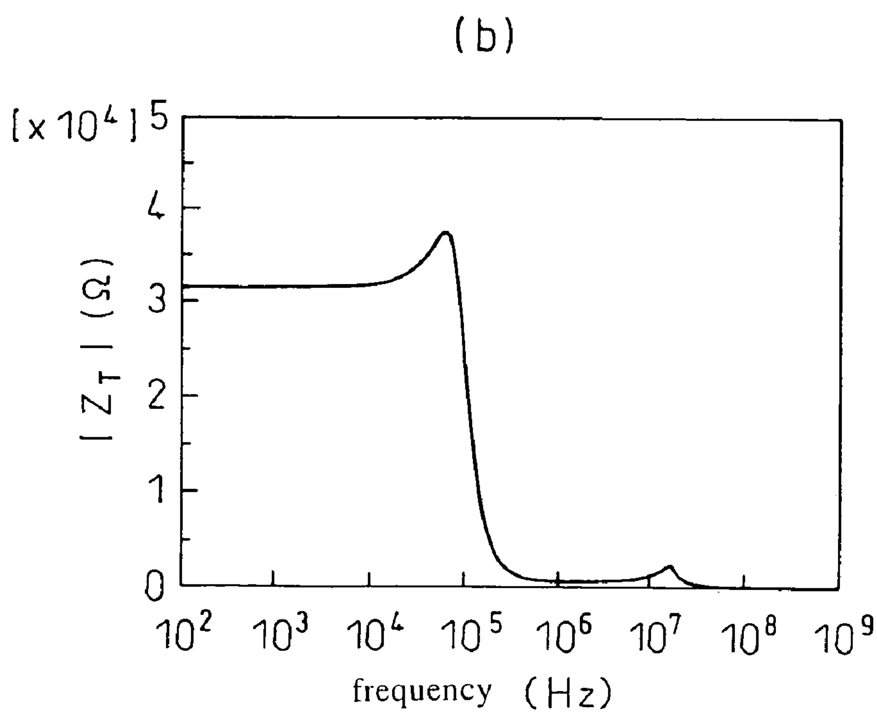

FIG. 27(*a*) shows a simulation result of the frequency-transfer impedance characteristic of the second-order lowpass active RC filter circuit having the elements arranged as above. According to this result, while the filter circuit has a transfer impedance less than 50 kO in a low frequency range, and a cutoff frequency of 105 kHz which are close to the targets, a large peak occurs at a high frequency of 16 MHz. Because the differential and integral calculus of $s/GB_1(1+R_1/R_5)$" and $(R_1/R_5)/(A+s/GB_2)$ in the denominator of the formula (58) causes a peak characteristic in an extremely high frequency region In order to prevent any peak characteristic from occurring in such a high frequency range, a capacitance Cs is connected in parallel with the resistor $R_5$ provided in the feedback section of the second-order lowpass active RC filter circuit in FIG. 26. The capacitor Cs primarily acts to compensate the $GB_2$ of the operational amplifier $OP_2$.

After connecting the capacitor Cs (5 pF) to the resistor $R_5$, the characteristic of the filter circuit having the elements arranged as described above was simulated. As a result, the frequency-transfer impedance characteristic as shown in FIG. 27(*b*) could be obtained. This result shows that the Q-value is increased up to 1.18 through the compensation of the $GB_2$, and the above targets are achieved.

(Highpass Active Filter Circuit)

Figure 28:
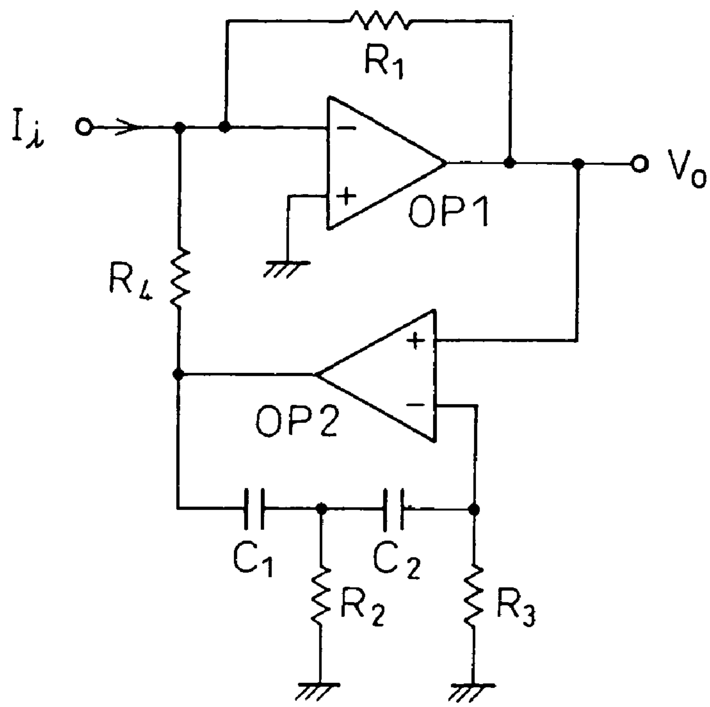
FIG. 28 is a block diagram showing a second-order highpass active RC filter circuit according to the second embodiment

FIG. 28 shows a second-order highpass active RC filter circuit using an op-amp-based negative-phase-sequence CCVS. The filter circuit comprises a feedforward section which includes a negative-phase-sequence CCVS based on an operational amplifier $OP_1$, and a feedback section which includes a frequency-dependent voltage follower composed of an operational amplifier $OP_2$ and a two-stage differentiation circuit having capacitors $C_1$, $C_2$, and resistor $R_2$, $R_3$. A higher-order highpass filter can be obtained by increasing the number of stages of the RC differentiation circuit. It is noted that this differentiation circuit provides a (1/s) polynomial equation for feedback transmission.

Given that each of the operational amplifiers is an ideal element, the transfer impedance function $Z_T(s)$ of the second-order highpass active RC filter circuit in FIG. 28 is expressed as follows:

$$Z_T = \frac{R_1}{1+\frac{R_1}{R_4}\cdot\frac{R_1}{R_4}\left[\frac{(C_1+C_2)R_2+C_2R_3}{sC_1C_2R_2R_3}+\frac{1}{s^2C_1C_2R_2R_3}\right]} \quad (60)$$

The constant "a", the center angular frequency $\omega_0$ and the Q-value are expressed as follows:

$$a = 1+\frac{R_1}{R_4} \quad (61)$$

$$\omega_P = \frac{1}{\sqrt{\left(1+\frac{R_1}{R_4}C_1C_2R_2R_3\right)}} \quad (62)$$

-continued $$Q = \frac{\sqrt{\left(1 + \frac{R_1}{R_4}\right) C_1 C_2 R_2 R_3}}{\frac{R_1}{R_4}[(C_1 + C_2)R_2 + C_2 R_3]} \quad (63)$$

With the targets of "a"=1.5, cutoff frequency $f_0$=175 kHz and Q-value=0.8, the characteristic of the second-order highpass active RC filter circuit in FIG. 28 was simulated by assigning the following values to the elements.

Capacitor $C_1=C_2=30$ (pF)

Resistor $R_1=50$, $R_2=R_3=25$, $R_4=100$ (kO)

Figure 29:
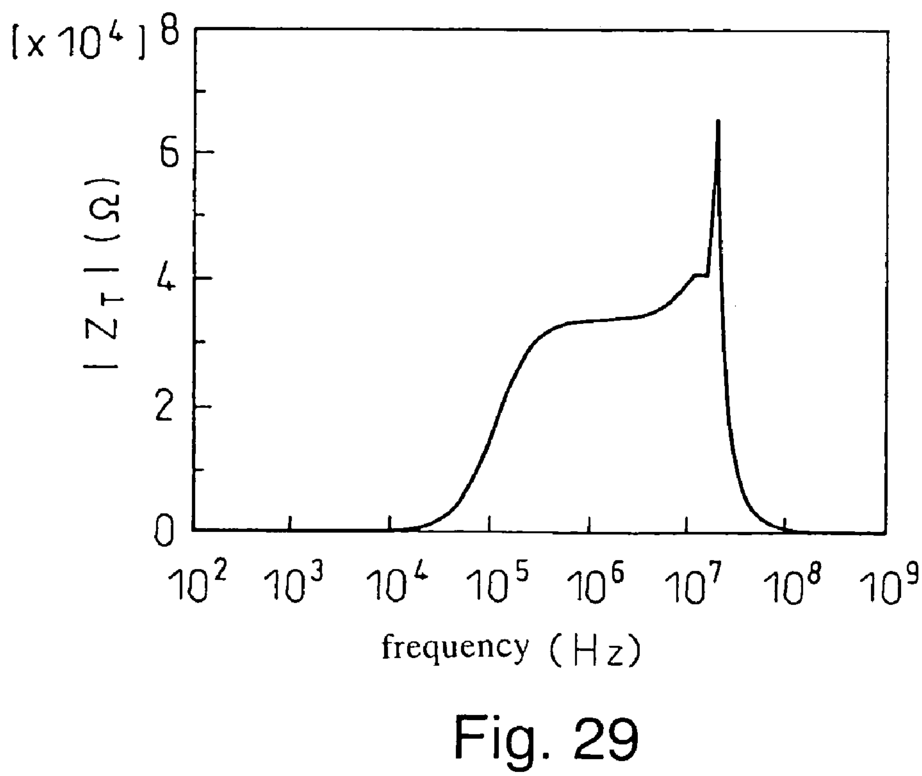
FIG. 29 is a graph showing a simulation result of the frequency-transfer impedance characteristic of the second-order highpass active RC filter circuit in FIG. 28.

FIG. 29 shows a simulation result of the frequency-transfer impedance characteristic of the second-order high-pass active RC filter circuit having the elements arranged as above. According to this result, as with the lowpass active RC filter circuit, a peak characteristic is exhibited at a high frequency of 18 MHz.

Thus, the transfer impedance function $Z_T(s)$ of the filter circuit determined based on the formula (60) by taking account of the influence of the finite GB products of the operation amplifiers is expressed as follows:

$$Z_T(S)=-R_1/[1+s/GB_1(1+R_1/R_4)+(R_1/R_4)/(A+s/GB_2)] \quad (64)$$

$$\text{wherein } A=1/[(C_1+C_2)R_2+C_2R_3)/sC_1C_2R_2R_3+1/s^2C_1C_2R_2R_3 \quad (65)$$

Figure 30:
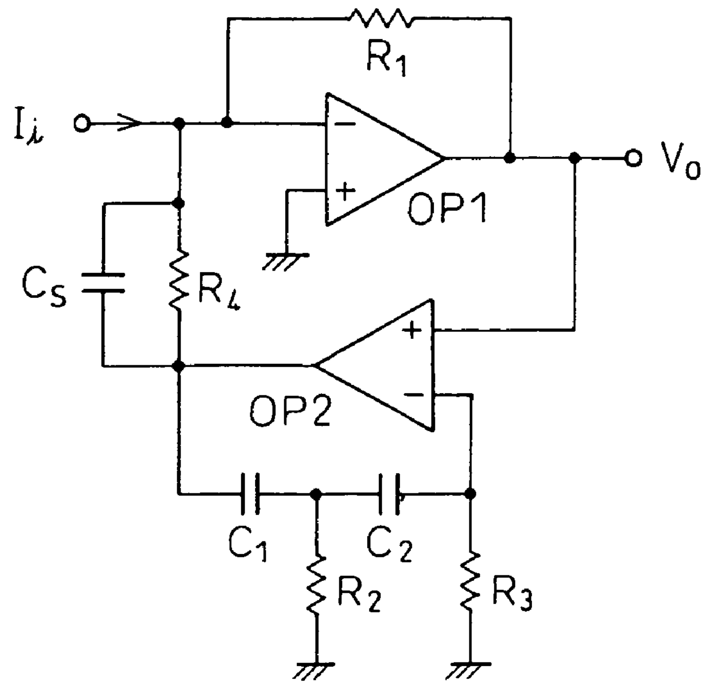
FIG. 30 is a block diagram showing one modification of the second-order highpass active RC filter circuit in FIG. 28, wherein the circuit is configured to eliminate the peak characteristic in FIG. 29.

As seen in these formulas, when the angular frequency ω is close to $GB_1$, $GB_2$, the "A" in the formula (65) can be negligible, and a peak characteristic is controlled by $s/GB_1(1+R_1/R_4)$ and $(R_1/R_4)/(A+s/GB_2)$. Thus, a capacitance Cs is connected in parallel with the resistor $R_4$ to compensate such a peak characteristic. FIG. 30 shows a modified circuit obtained by connecting the compensating capacitor Cs to the second-order highpass active RC filter circuit.

Figure 31:
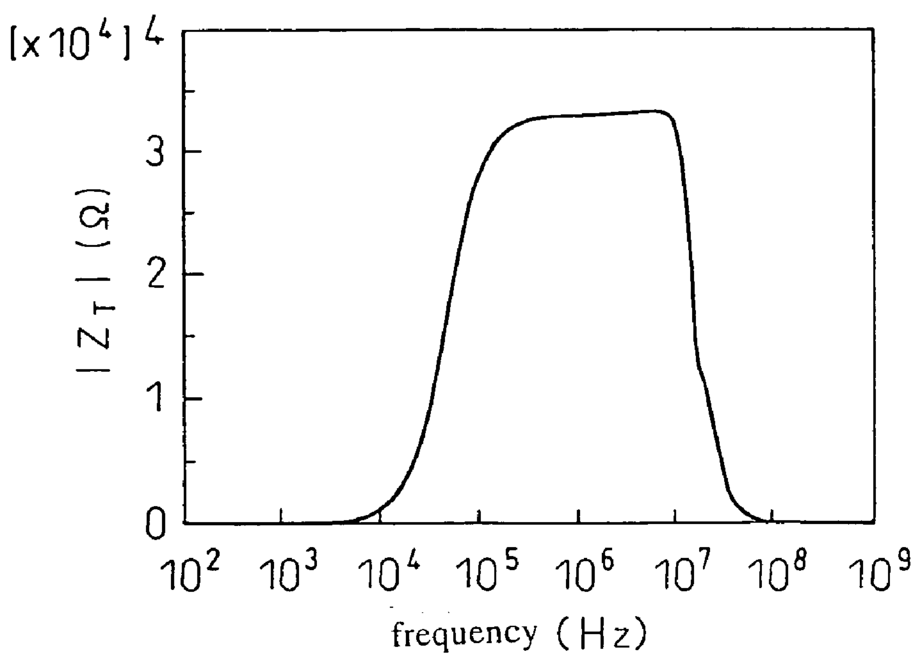
FIG. 31 is a graph showing a simulation result of the frequency-transfer impedance characteristic of the second-order highpass active RC filter circuit in FIG. 30.

The characteristic of the filter circuit having the capacitor Cs (0.3 pF) to the resistor $R_4$ was simulated by assigning the above values to the elements, and the result is shown in FIG. 31 as a frequency-transfer impedance characteristic. This result shows that a peak characteristic is desirably improved in a high frequency range by the capacitor Cs.

INDUSTRIAL APPLICABILITY

As mentioned above, in the present invention, an active RC signal processing circuit comprises a feedforward section, and a feedback section. The feedforward section includes a CCVS providing a given gain, and the feedback section is operable to negatively feed back the output of the feedforward section over the entire frequency range and provide a given transfer characteristic. Thus, the present invention can provide an active RC filter having a desired sensitivity of Q to variations of associated elements and a stable high-performance in high frequency bands without difficulties.

Through the negative feedback maintained over the entire frequency range, s high Q-value can be stably obtained to facilitate noise reduction in the active RC filter.

Further, the transfer characteristic of a signal processing circuit can be determined substantially by the values of capacitors and resistors. Thus, signal processing circuits can be readily designed without using any inductance, and the miniaturization/integration in signal processing circuits can be facilitated.

What is claimed is:

1. A low-noise active RC signal processing circuit comprising:

a feedforward section operable responsive to an input signal to provide an output at a predetermined gain; and a feedback section operable responsive to the output of said feedforward section to negatively feed back said output to the input signal of said feedforward section while giving a predetermined transfer characteristic to said output, so as to allow said processing circuit to have a transfer impedance characteristic equal to or less than said predetermined gain over the entire frequency range, wherein said feedforward section is a current-controlled voltage output circuit and wherein said current-controlled voltage output circuit includes an operational amplifier operable to invert the input signal, said operational amplifier being subjected to feedback according to the transfer impedance defining said predetermined gain.

2. A low-noise active RC signal processing circuit comprising:

a feedforward section operable responsive to an input signal to provide an output at a predetermined gain; and a feedback section operable responsive to the output of said feedforward section to negatively feed back said output to the input signal of said feedforward section while giving a predetermined transfer characteristic to said output, so as to allow said processing circuit to have a transfer impedance characteristic equal to or less than said predetermined gain over the entire frequency range, wherein said feedforward section is a current-controlled voltage output circuit, wherein said current-controlled voltage output circuit includes a common-base transistor for receiving and inverting the input signal, and an emitter-follower transistor for outputting voltage, said current-controlled voltage output circuit having a transfer impedance defining said predetermined gain, and wherein said feedback section is an active RC circuit having a multistage arrangement, said active RC circuit being operable to provide a frequency-dependent characteristic to the output from said feedforward section.

3. The low-noise active RC signal processing circuit as defined in claim 1, wherein said feedback section is a voltage-follower circuit operable to provide a frequency-dependent characteristic to the output from said feedforward section, said voltage-follower circuit including an operational amplifier and a multistage RC circuit.

4. The low-noise active RC signal processing circuit as defined in either one of claims 1 and 2, which is a bandpass filter, wherein said transfer impedance characteristic defines the frequency characteristic of said bandpass filter.

5. The low-noise active RC signal processing circuit as defined in either one of claims 1 and 2, which is a lowpass filter, wherein said transfer impedance characteristic defines the frequency characteristic of said lowpass filter.

6. The low-noise active RC signal processing circuit comprising:

a feedforward section operable responsive to an input signal to provide an output at a predetermined gain; and a feedback section operable responsive to the output of said feedforward section to negatively feed back said output to the input signal of said feedforward section while giving a predetermined transfer characteristic to said output, so as to allow said processing circuit to have a transfer impedance characteristic equal to or less than said predetermined gain over the entire frequency range, wherein said feedforward section is a current-controlled voltage output circuit, wherein said current-controlled voltage output circuit includes a common-base transistor for receiving and inverting the input signal, and an emitter-follower transistor for outputting voltage, said current-controlled voltage output circuit having a transfer impedance defining said predetermined gain, which is a highpass filter, wherein said transfer impedance characteristic defines the frequency characteristic of said highpass filter.

* * * * *